(12) United States Patent
Mizukawa et al.

(10) Patent No.: US 8,445,167 B2
(45) Date of Patent: May 21, 2013

(54) METAL PHTHALOCYANINE DYE MIXTURE, CURABLE COMPOSITION, COLOR FILTER, AND METHOD FOR PRODUCING COLOR FILTER

(75) Inventors: Yuki Mizukawa, Haibara-gun (JP); Hideki Takakuwa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 255 days.

(21) Appl. No.: 12/934,462

(22) PCT Filed: Mar. 16, 2009

(86) PCT No.: PCT/JP2009/055021
§ 371 (c)(1),
(2), (4) Date: Sep. 24, 2010

(87) PCT Pub. No.: WO2009/119364
PCT Pub. Date: Oct. 1, 2009

(65) Prior Publication Data
US 2011/0020738 A1  Jan. 27, 2011

(30) Foreign Application Priority Data
Mar. 25, 2008 (JP) .................................. 2008-078919

(51) Int. Cl.
*G02B 5/20* (2006.01)
(52) U.S. Cl.
USPC .......................................... 430/7; 430/270.1
(58) Field of Classification Search
None
See application file for complete search history.

(56) References Cited

U.S. PATENT DOCUMENTS

| 4,213,757 | A | 7/1980 | Ruske et al. | |
| 8,029,951 | B2 * | 10/2011 | Motoki et al. | 430/7 |
| 2004/0045478 | A1 | 3/2004 | Tateishi et al. | |
| 2008/0081268 | A1 * | 4/2008 | Motoki et al. | 430/7 |

FOREIGN PATENT DOCUMENTS

| JP | 53 24489 A | 3/1978 |
| JP | 6-75375 A | 3/1994 |
| JP | 2002-14221 A | 1/2002 |
| JP | 2002-14222 A | 1/2002 |
| JP | 2002-302623 A | 10/2002 |
| JP | 2003-321634 A | 11/2003 |
| JP | 2004-43757 A | 2/2004 |
| JP | 2004 331734 A | 11/2004 |
| JP | 2006-47497 A | 2/2006 |
| JP | 2007-224268 A | 9/2007 |
| WO | 2006-041106 A1 | 4/2006 |

OTHER PUBLICATIONS

Extended European Search Report dated Sep. 28, 2012 in EP 09 72 5875.

Office Action dated Jan. 22, 2013 in Japanese Application No. 2008-078919.

* cited by examiner

*Primary Examiner* — John A. McPherson
(74) *Attorney, Agent, or Firm* — Sughrue Mion, PLLC

(57) ABSTRACT

The invention aims to provide a metal phthalocyanine dye mixture having excellent solubility in an organic solvent, which can be formed into a thin film. Provided are a metal phthalocyanine dye mixture contains at least phthalonitrile, a compound represented by the following formula (I), a compound represented by the following formula (II), and a metal or a metal compound, and a curable composition containing the metal phthalocyanine dye mixture, a color filter containing the curable composition, and a method for producing the color filter:

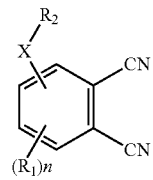

FORMULA (I)

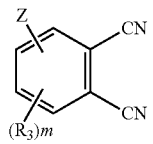

FORMULA (II)

wherein, in formulae (I) and (II), $R_1$ represents a substituent; n represents an integer of from 0 to 3; X represents —S—, —$SO_2$—, or —$SO_2N(R_4)$—; $R_4$ represents a hydrogen atom, an alkyl group, an alkenyl group, an aryl group, or a heterocyclic ring group; $R_2$ represents an alkyl group, an alkenyl group, an aryl group, or a heterocyclic ring group; $R_3$ represents a substituent; m represents an integer of from 0 to 3; and Z represents —$SO_3M$ or —($X_1$-A) group; wherein $X_1$ has the same definition as X; A represents an optionally substituted group having at least one selected from —COOM, —$SO_3M$, —$SO_2NH$—$R_5$, —$SO_2NHCOR_6$, —$CONHSO_2$—$R_7$, and —$SO_2NHSO_2$—$R_8$; M represents a hydrogen atom, or an alkali metal or organic base group for neutralization of charges; and $R_5$, $R_6$, $R_7$, and $R_8$ each independently represents an alkyl group, an alkenyl group, an aryl group, or a heterocyclic ring group.

5 Claims, No Drawings

METAL PHTHALOCYANINE DYE MIXTURE, CURABLE COMPOSITION, COLOR FILTER, AND METHOD FOR PRODUCING COLOR FILTER

TECHNICAL FIELD

The present invention relates to a metal phthalocyanine dye mixture which is suitable for forming a color filter used for a liquid crystal display device or a solid-state imaging device, a curable composition containing the metal phthalocyanine dye mixture, a color filter using the curable composition, and a method for producing the color filter.

BACKGROUND ART

A pigment dispersion method is used in one of the methods for preparing a color filter used for a liquid crystal display device, a solid-state imaging device, or the like. Examples of the pigment dispersion method may include a method of producing a color filter using a photolithographic method using a colored radiation-sensitive composition having a pigment dispersed in various photosensitive compositions. This method has been widely used as a method suitable for preparing a color filter for a large-screen high-definition color display since it is stable against light or heat as a result of the use of a pigment, and further, can ensure sufficiently positional precision for patterning according to a photolithographic method.

When a color filter is prepared by the pigment dispersion method, a radiation-sensitive composition is applied onto a substrate using a spin coater, a roll coater, or the like, and dried to form a coating film, and the colored image pixels are formed by pattern exposure and development of the coating film. This operation for respective colors can be repeated to prepare a color filter.

However, the color filter for a solid-state imaging device has been required to have high precision in recent years, and it has been difficult to further improve the resolution according to the conventional pigment dispersion system. Further, the pigment dispersion method is not suitable for applications requiring fine patterning such as a solid-state imaging device because of the occurrence of color unevenness due to coarse particles of the pigment, or the like.

In order to achieve the above-mentioned high resolution, there has been conventionally proposed the use of a dye as a dye (see, for example, Japanese Patent Application Laid-Open (JP-A) 6-75375). However, it could be seen that a curable composition containing the dye has further new problems as follows.

(1) The dye is generally inferior in terms of light-fastness and heat resistance, as compared with pigments.

(2) General coloring materials have a low solubility in an alkali aqueous solution or in an organic solvent (hereinafter also simply referred to as a solvent), and therefore, it is difficult to obtain a liquid-state curable composition having a desired spectrum.

(3) The dye exerts an interaction with other components in the curable composition, and accordingly, it is difficult to control the solubility (developability) of a cured portion and an uncured portion.

(4) If the molar absorption coefficient ($\epsilon$) of the dye is low, it is necessary to add a large amount of the dye, for which the amount of other components such as a polymerizable compound (monomer), a binder, a photopolymerization initiator, and the like in the curable composition must be reduced, and problems occur where the curability of the composition, the heat resistance, the developability of the (un)cured portion, or the like would be reduced after curing.

Due to these problems, it has been difficult to form a colored pattern constituted on a fine thin film for a high precision color filter so far. Also, unlike a case of the applications for preparation of a semiconductor or the like, in the case of the applications for preparation of a color filter for a solid-state imaging device, for example, it is required that the film have a small thickness of 1 μm or less. Therefore, in order to obtain a desired absorption, it is necessary to add a large amount of the coloring material into the curable composition, which results in the problem as described above.

Conventionally, a phthalocyanine dye has been widely used as a pigment in green or blue color filters. Further, its usefulness when it used as a dye has been also known (see, for example, JP-A No. 2002-14221, JP-A No. 2002-14222, and JP-A No. 2006-47497). However, in the case where a phthalocyanine is used, in order to satisfy the solubility in an organic solvent, various substituents should be introduced. As a result, the molecular weight increases, and therefore, in order to obtain a desired absorption, it is necessary to add a large amount of the coloring material into the curable composition, which results in the problem as described above. Accordingly, a dye which does not cause an increase in molecular weight and satisfies the solubility in an organic solvent is demanded.

Furthermore, conventionally, a dye has been required to have high fastness. Specifically, a colorant used in various applications is generally required to have the following properties in common. That is, it is necessary that the dye have preferable absorption characteristics in terms of color reproducibility, fastness under the environment condition for use, for example, good heat resistance, light-fastness, moisture resistance, or the like, and a high molar absorption coefficient, and be capable of being formed into a thin film.

DISCLOSURE OF INVENTION

Objects to be Achieved by the Invention

It is an object of the invention to provide a metal phthalocyanine dye mixture useful for a primary color-based color filter in blue, green, or red, and a complementary color-based color filter in yellow, magenta, or cyan, which has excellent solubility in an organic solvent and can be formed into a thin film, and a curable composition containing the metal phthalocyanine dye mixture, which is excellent in storage stability, and it is the object of this invention to solve this problem.

Furthermore, it is another object to provide a color filter using the curable composition, which is excellent in fastness and also capable of being formed into a thin layer, and a method for producing the same, it is the object of this invention to solve this problem.

Means for Solving the Problems

The invention has been made by conducting extensive studies on various phthalocyanine dyes, and thus, discovering that a metal phthalocyanine dye mixture formed by using at least three kinds of the phthalonitrile compound is suitable for being used as a dye of forming a pattern. Also, it has been known that such a constitution makes it possible for the dye to have good color and good fastness against heat and light, with excellent solubility in an organic solvent by forming a mixture of the dyes, and a thin film can be made through reduction of the amount added thereby lessening the molecular weight, and the invention has been accomplished based on this knowledge.

Specific means for solving the problems are as follows.

<1> A metal phthalocyanine dye mixture comprising at least phthalonitrile, a compound represented by the following formula (I), a compound represented by the following formula (II), and a metal or a metal compound:

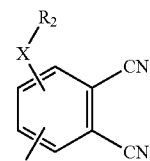

FORMULA (I)

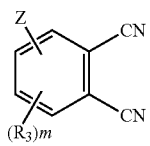

FORMULA (II)

wherein, in formulae (I) and (II), $R_1$ represents a substituent; n represents an integer of from 0 to 3; X represents —S—, —SO$_2$—, or —SO$_2$N(R$_4$)—; $R_4$ represents a hydrogen atom, an alkyl group, an alkenyl group, an aryl group, or a heterocyclic ring group; $R_2$ represents an alkyl group, an alkenyl group, an aryl group, or a heterocyclic ring group; $R_3$ represents a substituent; m represents an integer of from 0 to 3; and Z represents —SO$_3$M or —(X$_1$-A) group; wherein X$_1$ has the same definition as X; A represents an optionally substituted group having at least one selected from —COOM, —SO$_3$M, —SO$_2$NH—R$_5$, —SO$_2$NHCOR$_6$, —CONHSO$_2$—R$_7$, and —SO$_2$NHSO$_2$—R$_8$; M represents a hydrogen atom, or an alkali metal or organic base group for neutralization of charges; and $R_5$, $R_6$, $R_7$, and $R_8$ each independently represents an alkyl group, an alkenyl group, an aryl group, or a heterocyclic ring group.

<2> The metal phthalocyanine dye mixture according to <1>, wherein the metal phthalocyanine dye mixture comprises at least one selected from a compound represented by the following formula (A) or a compound represented by the following formula (B):

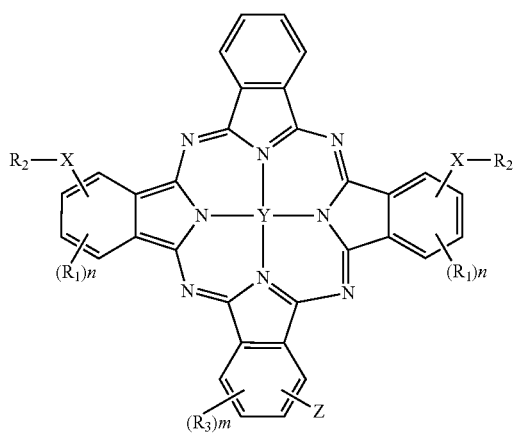

FORMULA (A)

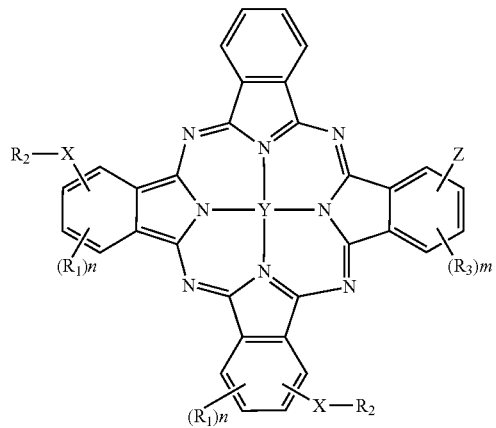

FORMULA (B)

wherein, in formulae (A) and (B), $R_1$, $R_2$, $R_3$, X, Z, n, and m have the same definitions as $R_1$, $R_2$, $R_3$, X, Z, n, and m, respectively, in the formulae (I) and (II); and Y represents a metal atom or a metal compound.

<3> The metal phthalocyanine dye mixture according to <2>, wherein Y in the compound represented by the formula (A) or in the compound represented by the formula (B) is Cu.

<4> A curable composition comprising the metal phthalocyanine dye mixture according to any one of <1> to <3>.

<5> A color filter formed by using the curable composition according to <4>.

<6> A method for producing a color filter, comprising the steps of applying the curable composition according to <4> to a support, and then carrying out exposure and development via a mask to form a pattern.

Effects of the Invention

According to the invention, there can be provided a metal phthalocyanine dye mixture which is useful as a color filter, has excellent color purity and excellent fastness as well as excellent solubility in an organic solvent, and can be formed into a thin film, and a curable composition using the metal phthalocyanine dye mixture, which has excellent storage stability.

Furthermore, a color filter which has excellent color purity and excellent fastness, and, can be formed into a thin film, by using the curable composition, and a method for producing the same, can be provided.

BEST MODE FOR CARRYING OUT THE INVENTION

Hereinbelow, the metal phthalocyanine dye mixture, the curable composition, the color filter, and the method for producing the color filter of the invention will be described in detail.

<<Metal Phthalocyanine Dye Mixture>>

The metal phthalocyanine dye mixture of the invention is characterized in that it is formed by incorporating phthalonitrile as a colorant, a compound represented by the following formula (I), a compound represented by the following formula (II), and a metal or metal compound. Since the metal phthalocyanine dye mixture of the invention has such a composition, it has excellent color purity and excellent fastness as well as excellent solubility in an organic solvent, and can be formed into a thin film.

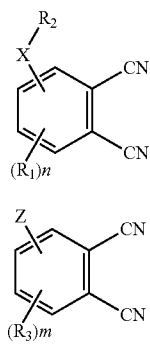

FORMULA (I)

FORMULA (II)

wherein, in formulae (I) and (II), $R_1$ represents a substituent; n represents an integer of from 0 to 3; X represents —S—, —$SO_2$—, or —$SO_2N(R_4)$—; $R_4$ represents a hydrogen atom, an alkyl group, an alkenyl group, an aryl group, or a heterocyclic ring group; $R_2$ represents an alkyl group, an alkenyl group, an aryl group, or a heterocyclic ring group; $R_3$ represents a substituent; m represents an integer of from 0 to 3; and Z represents —$SO_3M$ or —($X_1$-A) group; wherein $X_1$ has the same definition as X; A represents an optionally substituted group having at least one selected from —COOM, —$SO_3M$, —$SO_2NH$—$R_5$, —$SO_2NHCOR_6$, —$CONHSO_2$—$R_7$, and —$SO_2NHSO_2$—$R_8$; M represents a hydrogen atom, or an alkali metal or organic base group for neutralization of charges; and $R_5$, $R_6$, $R_7$, and $R_8$ each independently represents an alkyl group, an alkenyl group, an aryl group, or a heterocyclic ring group.

—Compound Represented by Formula (I) and Compound Represented by Formula (II)—

Hereinbelow, the compound represented by the formula (I) and the compound represented by the formula (II) will be described, with focus on the description on each group.

$R_1$ and $R_3$ in the formulae (I) and (II) each independently represent a substituent, and examples of the substituent represented by $R_1$ or $R_3$ include halogen atoms (for example, fluorine, chlorine, bromine, iodine), an alkyl group (straight-chained, branched, or cyclic alkyl groups having preferably 1 to 36 carbon atoms, and more preferably 1 to 12 carbon atoms; for example, methyl, ethyl, propyl, butyl, octyl, dodecyl, isopropyl, sec-butyl, t-butyl, 2-ethylhexyl, cyclopentyl, cyclohexyl, 1-norbornyl, 1-adamantyl), an alkenyl group (preferably alkenyl groups having preferably 2 to 36 carbon atoms, more preferably 2 to 12 carbon atoms, for example, vinyl, aryl, 3-buten-1-yl), an aryl group (aryl groups having preferably 6 to 36 carbon atoms, more preferably 6 to 12 carbon atoms, for example, phenyl, naphthyl), a heterocyclic group (heterocyclic groups having preferably 1 to 24 carbon atoms, more preferably 1 to 12 carbon atoms, for example, 2-thienyl, 4-pyridyl, 2-furyl, 2-pyrimidinyl, 1-pyridyl, 2-benzothiazoyl, 1-imidazolyl, 1-pyrazolyl, benzotriazol-1-yl), a silyl group (silyl groups having preferably 3 to 24 carbon atoms, more preferably 3 to 12 carbon atoms, for example, trimethylsilyl, triethylsilyl, tributylsilyl, t-butyldimethylsilyl, t-hexyldimethylsilyl), a hydroxyl group, a cyano group, a nitro group, an alkoxy group (alkoxy groups having preferably 1 to 36 carbon atoms, more preferably 1 to 12 carbon atoms, for example, methoxy, ethoxy, 1-butoxy, 2-butoxy, isopropoxy, t-butoxy, dodecyloxy, cycloalkyloxy group (for example, cyclopentyloxy, cyclohexyloxy)), aryloxy group (aryloxy groups having preferably 6 to 36 carbon atoms, more preferably 6 to 12 carbon atoms, for example, phenoxy, 1-naphthoxy), a heterocyclic oxy group (heterocyclic oxy groups having preferably 1 to 36 carbon atoms, more preferably 1 to 12 carbon atoms, for example, 1-phenyltetrazol-5-oxy, 2-tetrahydropyranyloxy), a silyloxy group (silyloxy groups having preferably 1 to 32 carbon atoms, more preferably 1 to 12 carbon atoms, for example, trimethylsilyloxy, t-butyldimethylsilyloxy, diphenylmethylsilyloxy), an acyloxy group (acyloxy groups having preferably 2 to 36 carbon atoms, more preferably 2 to 12 carbon atoms, for example, acetoxy, pivaloyloxy, benzoyloxy, dodecanoyloxy), an alkoxycarbonyloxy group (alkoxycarbonyloxy groups having preferably 2 to 36 carbon atoms, more preferably 2 to 12 carbon atoms, for example, ethoxycarbonyloxy, t-butoxycarbonyloxy, a cycloalkyloxycarbonyloxy group (for example, cyclohexyloxycarbonyloxy)), an aryloxycarbonyloxy group (aryloxycarbonyloxy groups having preferably 7 to 32 carbon atoms, more preferably 7 to 12 carbon atoms, for example, phenoxycarbonyloxy), carbamoyloxy group (carbamoyloxy groups having preferably 1 to 36 carbon atoms, more preferably 1 to 12 carbon atoms, for example, N,N-dimethylcarbamoyloxy, N-butylcarbamoyloxy, N-phenylcarbamoyloxy, N-ethyl-N-phenylcarbamoyloxy), a sulfamoyloxy group (sulfamoyloxy groups having preferably 1 to 32 carbon atoms, more preferably 1 to 12 carbon atoms, for example, N,N-diethylsulfamoyloxy, N-propylsulfamoyloxy), alkylsulfonlyoxy group (alkylsulfonyloxy groups having preferably 1 to 38 carbon atoms, more preferably 1 to 12 carbon atoms, for example, methylsulfonlyoxy, hexadecylsulfonlyoxy, cyclohexylsulfonlyoxy), an arylsulfonlyoxy group (arylsulfonyloxy groups having preferably 6 to 32 carbon atoms, more preferably 6 to 12 carbon atoms, for example, phenylsulfonlyoxy), an acyl group (acyl groups having preferably 1 to 36 carbon atoms, more preferably 1 to 12 carbon atoms, for example, formyl, acetyl, pivaloyl, benzoyl, tetradecanoyl, cyclohexanoyl), an alkoxycarbonyl group (alkoxycarbonyl groups having preferably 2 to 36 carbon atoms, more preferably 2 to 12 carbon atoms, for example, methoxycarbonyl, ethoxycarbonyl, octadecyloxycarbonyl, cyclohexyloxycarbonyl, 2,6-di-tert-butyl-4-methylcyclohexyloxycarbonyl), an aryloxycarbonyl group (aryloxycarbonyl groups having preferably 7 to 32 carbon atoms, more preferably 7 to 18 carbon atoms, for example, phenoxycarbonyl), a carbamoyl group (carbamoyl groups having preferably 1 to 36 carbon atoms, more preferably 1 to 12 carbon atoms, for example, carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, N,N-dicyclohexylcarbamoyl), an amino group (amino groups having preferably 32 or fewer carbon atoms, more preferably 12 or fewer carbon atoms, for example, amino, methylamino, N,N-dibutylamino, tetradecylamino, 2-ethylhexylamino, cyclohexylamino), an anilino group (anilino groups having preferably 6 to 32 carbon atoms, more preferably 6 to 12 carbon atoms, for example, anilino, N-methylanilino), a heterocyclic amino group (heterocyclic amino groups having preferably 1 to 32 carbon atoms, more preferably 1 to 12 carbon atoms, for example, 4-pyridylamino), a carbonamido group (carbonamido groups having preferably 2 to 36 carbon atoms, more preferably 2 to 12 carbon atoms, for example, acetamide, benzamide, tetradecanamide, pivaroylamide, cyclohexanamide), a ureido group (ureido groups having preferably 1 to 32 carbon atoms, more preferably 1 to 12 carbon atoms, for example, ureido, N,N-dimethylureido, N-phenylureido), an imide group (imide groups having preferably 36 or fewer carbon atoms, more preferably 12 or fewer carbon atoms, for example, N-succinimide, N-phthalimide), an alkoxycarbonylamino group (alkoxycarbonylamino groups having preferably 2 to 36 carbon atoms, more preferably 2 to 12 carbon atoms, for example, methoxycarbonylamino, ethoxycarbonylamino, t-butoxycarbonylamino, octadecyloxycarbonylamino, cyclohexyloxycarbonylamino), aryloxycarbonylamino group (aryloxycarbonylamino groups having preferably 7 to 32 carbon atoms, more preferably 7 to 18 carbon atoms, for example, phenoxycarbonylamino), a sulfonamide group (sulfonamide groups having preferably 1 to 36 carbon atoms, more preferably 1 to 12 carbon atoms, for example, methanesulfonamide, butanesulfonamide, benzenesulfonamide, hexadecanesulfonamide, cyclohexanesulfonamide), a sulfamoylamino group (sulfamoylamino groups having preferably 1 to 36 carbon atoms, more preferably 1 to 12 carbon atoms, for example, N,N-dipropylsulfamoylamino, N-ethyl-N-dodecylsulfamoylamino), an azo group (azo groups having preferably 1 to 32 carbon atoms, more preferably 1 to 18 carbon atoms, for example, phenylazo, 3-pyrazolylazo), an alkylthio group (alkylthio groups having preferably 1 to 36 carbon atoms, more preferably 1 to 12 carbon atoms, for example, methylthio, ethylthio, octylthio, cyclohexylthio), an arylthio group (arylthio groups having preferably 6 to 36 carbon atoms, more preferably 6 to 18 carbon atoms, for example, phenylthio), a heterocyclic thio group (heterocyclic thio groups having preferably 1 to 32 carbon atoms, more preferably 1 to 12 carbon atoms, for example, 2-benzothiazoylthio, 2-pyridylthio, 1-phenyltetrazolylthio), an alkylsulfinyl group (arylsulfinyl groups having preferably 1 to 32 carbon atoms, more preferably 1 to 12 carbon atoms, for example, dodecanesulfinyl), an arylsulfinyl group (arylsulfinyl groups having preferably 6 to 32 carbon atoms, more preferably 6 to 12 carbon atoms, for example, phenylsulfinyl), an alkylsulfonly group (alkylsulfonyl groups having preferably 1 to 36 carbon atoms, more preferably 1 to 12 carbon atoms, for example, methylsulfonly, ethylsulfonly, propylsulfonly, butylsulfonly, isopropylsulfonly, 2-ethylhexylsulfonly, hexadecylsulfonly, octylsulfonly, cyclohexylsulfonly), an arylsulfonly group (arylsulfonyl groups having preferably 6 to 36 carbon atoms, more preferably 6 to 12 carbon atoms, for example, phenylsulfonly, 1-naphthylsulfonly), a sulfamoyl group (sulfamoyl groups having preferably 32 or fewer carbon atoms, more preferably 12 or fewer carbon atoms, for example, sulfamoyl, N,N-dipropylsulfamoyl, N-ethyl-N-dodecylsulfamoyl, N-ethyl-N-phenylsulfamoyl, N-cyclohexylsulfamoyl), a sulfo group, a phosphonyl group (phosphonyl groups having preferably 1 to 32 carbon atoms, more preferably 1 to 12 carbon atoms, for example, phenoxyphosphonyl, octyloxyphosphonyl, phenylphosphonyl), a phosphinoylamino group (phosphinoylamino groups having preferably 1 to 32 carbon atoms, more preferably 1 to 12 carbon atoms, for example, diethoxyphosphinoylamino, dioctyloxyphosphinoylamino), and a carboxy group.

If the substituent represented by $R_1$ or $R_3$ is a group which may be substituted with other substituents, it may be substituted with a group listed as specific examples of the substituent represented by $R_1$ or $R_3$, and if the group has two or more substituents, those substituents may be the same as or different from each other.

Preferable examples of $R_1$ and $R_3$ include a halogen atom, an alkyl group, a heterocyclic group, an alkoxy group, an aryloxy group, an alkylthio group, an arylthio group, a heterocyclic thio group, an alkylsulfonly group, an arylsulfonly group, a sulfamoyl group, a carboxy group, and a sulfo group.

n in the formula (I) represents an integer of 0 to 3, and m in the formula (II) represents an integer of 0 to 3. n and m in the formulae (I) and (II) are preferably 0 or 1, and most preferably 0.

X in the formula (I) represents —S—, —SO$_2$—, or —SO$_2$N(R$_4$)—. $R_4$ represents a hydrogen atom, an alkyl group, an alkenyl group, an aryl group, or a heterocyclic group.

The alkyl group, the alkenyl group, the aryl group, and the heterocyclic group represented by $R_4$ respectively have the same preferable definitions as the alkyl group, the alkenyl group, the aryl group, and the heterocyclic group that are exemplified as specific examples of the substituent represented by $R_1$ or $R_3$ above. If the alkyl group, the alkenyl group, the aryl group, and the heterocyclic group represented by $R_4$ is a group which may be substituted with other substituents, it may be substituted by the group that is exemplified as specific examples of the substituent represented by $R_1$ or $R_3$ above, and if it is substituted with two or more substituents, those substituents may be the same as or different from each other.

X in the formula (I) is preferably —SO$_2$— or —SO$_2$N(R$_4$)—, and most preferably —SO$_2$— in terms of the spectral characteristics in the case of the use for a blue filter. Further, in the case of the use for a green filter, —S— is preferable in terms of the spectral characteristics.

$R_2$ in the formula (I) represents an alkyl group, an alkenyl group, an aryl group, or a heterocyclic group, and it has the same preferable definition as the alkyl group, the alkenyl group, the aryl group, and the heterocyclic group that are exemplified as specific examples of the substituent represented by $R_1$ or $R_3$ above.

The alkyl group, the alkenyl group, the aryl group, and the heterocyclic group represented by $R_2$ may be also substituted by the group that is exemplified as specific examples of the substituent represented by $R_1$ or $R_3$ above, and if it is substituted with two or more substituents, those substituents may be the same as or different from each other.

$R_2$ is preferably an alkyl group, an aryl group, or a heterocyclic group.

Furthermore, if X in the formula (I) is —S—, $R_2$ is preferably an alkyl group or an aryl group, and most preferably an aryl group.

If X is —SO$_2$—, $R_2$ i preferably an alkyl group or an aryl group, and most preferably an alkyl group.

Z in the formula (II) represents an —SO$_3$M, or —(X$_1$-A) group, and M represents a hydrogen atom, or an alkali metal or organic base group for neutralization of charges.

Examples of the alkali metal represented by M include lithium, sodium, potassium, calcium, barium, and strontium.

Examples of the organic base represented by M include ammonium, trialkylammonium (for example, trimethylammonium, triethylammonium, tributylammonium, triethanolammonium), tetraammonium (for example, tetraethylammonium, tetrabutylammonium), and the like.

M is preferably a hydrogen atom, potassium, sodium, or trialkylammonium, and more preferably a hydrogen atom or trialkylammonium.

In the formula (II), $X_1$ in the —(X$_1$-A) group represented by Z has the same definition and the same preferable definition as X in the formula (I).

Z in the formula (II) is preferably an —(X$_1$-A) group.

A in Z represents an optionally substituted group having at least one selected from —COOM, —SO$_3$M, —SO$_2$NH—R$_5$, —SO$_2$NHCOR$_6$, —CONHSO$_2$—R$_7$, —SO$_2$NHSO$_2$—R$_8$. Further, the "optionally substituted group" means those including embodiments substituted with other substituents. Examples of the other embodiments include an alkyl group, an alkenyl group, an aryl group, and a heterocyclic group, and preferably an alkyl group or an aryl group.

A is preferably —COOM, —SO$_3$M, or —SO$_2$NHCOR$_6$.

R$_5$, R$_6$, R$_7$, and R$_8$ each independently represent an alkyl group, an alkenyl group, an aryl group, or a heterocyclic group.

The alkyl group, the alkenyl group, the aryl group, and the heterocyclic group represented by R$_5$, R$_6$, R$_7$, and R$_8$ have the same preferable definitions as the alkyl group, the alkenyl group, the aryl group, and the heterocyclic group that are exemplified as specific examples of the substituent represented by R$_1$ or R$_3$ above.

The alkyl group, the alkenyl group, the aryl group, and the heterocyclic group represented by R$_5$, R$_6$, R$_7$, and R$_8$ may be also substituted with the group exemplified as specific examples of the substituent represented by R$_1$ or R$_3$ above, and if it is substituted with two or more substituents, those substituents may be the same as or different from each other.

R$_5$, R$_6$, R$_7$, and R$_8$ are preferably an alkyl group or an aryl group.

The metal phthalocyanine dye mixture of the invention may be any dye mixture formed by combination of at least one of the compounds represented by the formula (I), at least one of the compounds represented by the formula (II), and phthalonitrile at arbitrary molar ratios. As a result of the synthesis, any one of the following dyes can be obtained, such as a dye formed only from phthalonitrile, a dye formed only from the formula (I), a dye formed only from the formula (II), a dye formed from phthalonitrile and the formula (I), a dye formed from phthalonitrile and the formula (II), a dye formed from the formula (I) and the formula (II), a dye formed from phthalonitrile, the formula (I), and the formula (II).

The metal phthalocyanine dye mixture of the invention is preferably a mixture containing at least one selected from the metal phthalocyanine dyes represented by the formulae (A) and (B).

Next, the formulae (A) and (B) will be described.

FORMULA (A)

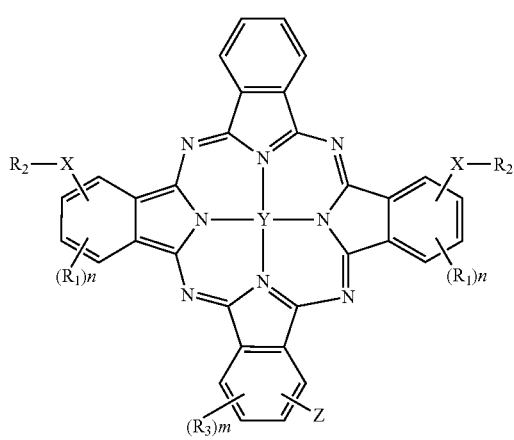

-continued

FORMULA (B)

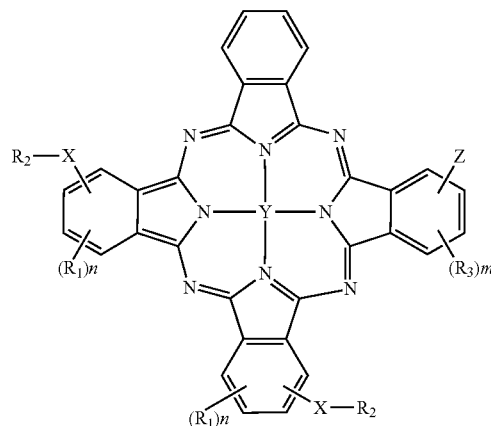

wherein, in formulae (A) and (B), R$_1$, R$_2$, R$_3$, X, Z, n, and m have the same definitions as R$_1$, R$_2$, R$_3$, X, Z, n, and m, respectively, in the formulae (I) and (II); and Y represents a metal atom or a metal compound.

In the formulae (A) and (B), R$_1$, R$_2$, R$_3$, X, Z, n, and m have the same preferable definitions as those in the formulae (I) and (II).

In the formulae (A) and (B), Y represents a metal atom or a metal compound. Examples of the metal atom represented by Y include Mn, Fe, Co, Ni, Cu, Zn, Sn, Pb, and Pt, and examples of the metal compound include V=O, Ti=O, AlCl, and the like.

Y is preferably Co, Cu, or Zn, and most preferably Cu.

Furthermore, the sum of the contents of the metal phthalocyanine dye represented by the formulae (A) and (B) in the metal phthalocyanine dye mixture of the invention is preferably 5% by mass or more, more preferably 10% by mass or more, and particularly preferably 25% by mass or more.

Next, specific examples of the compound represented by the formulae (I) and (II) are shown below, but the invention is not limited thereto.

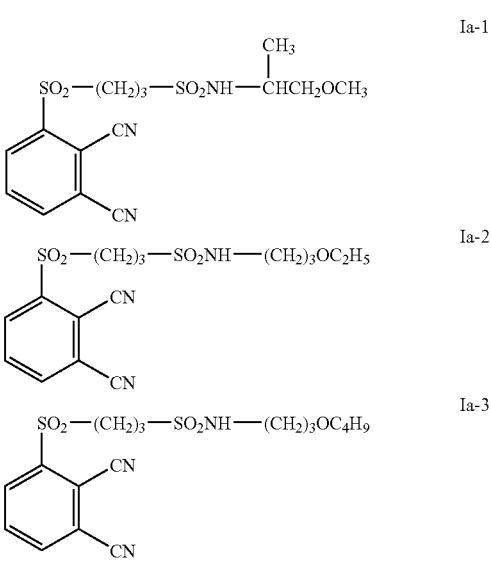

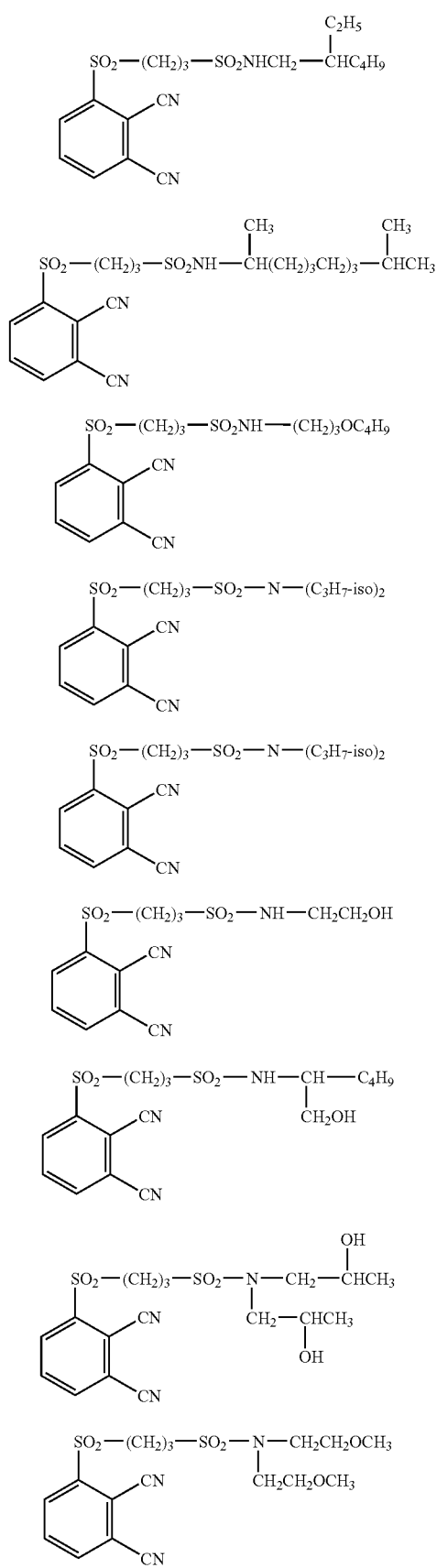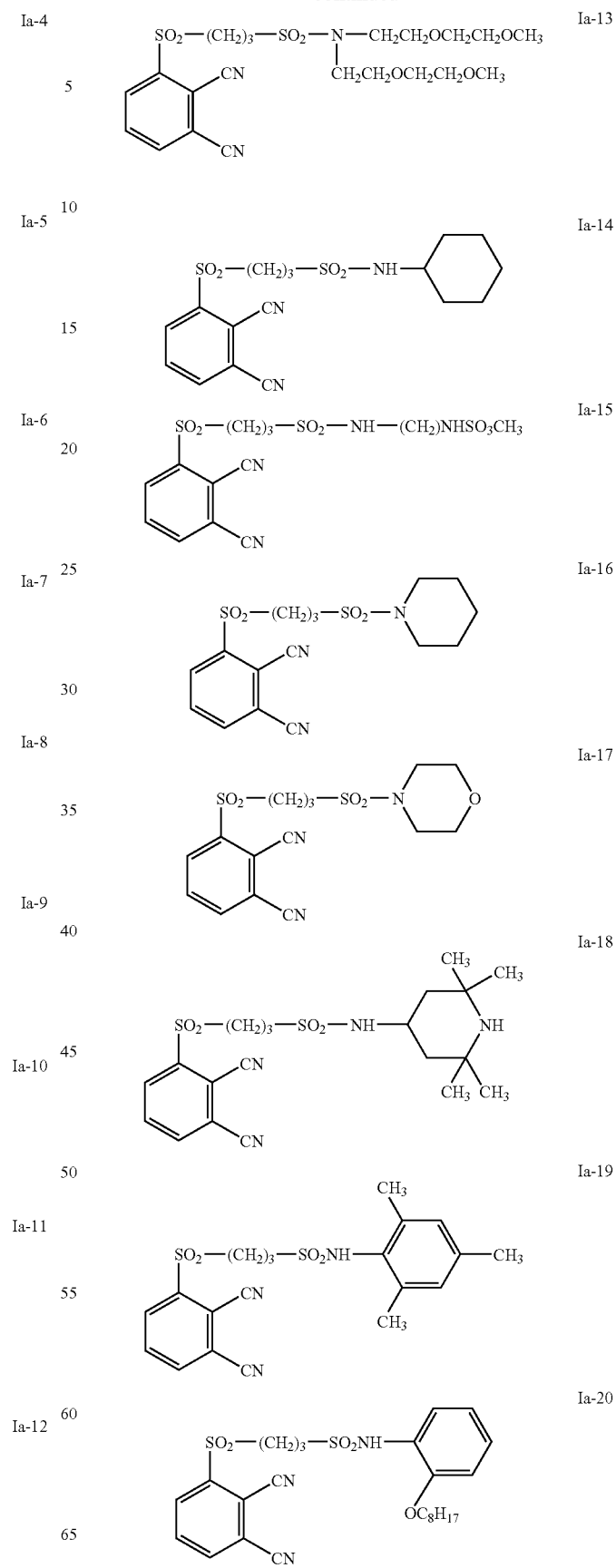

-continued
Ia-21
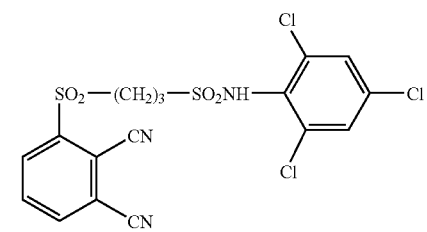
Ia-22
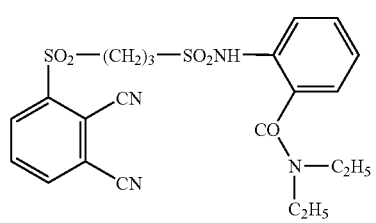
Ia-23
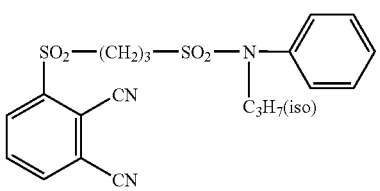
Ia-24
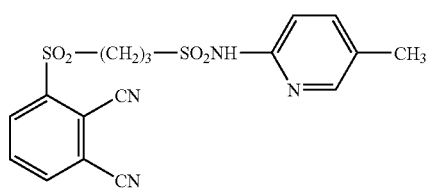
Ia-25
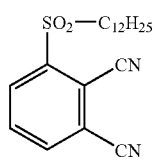
Ia-26
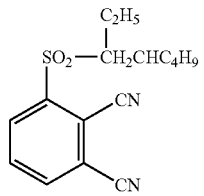
Ia-27
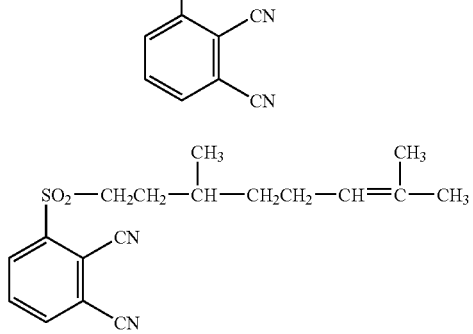
Ia-28
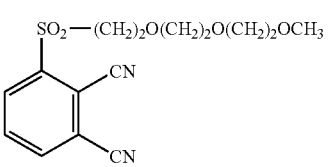
-continued
Ia-29
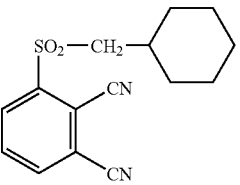
Ia-30
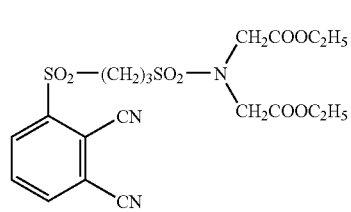
Ia-31
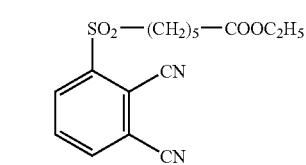
Ia-32
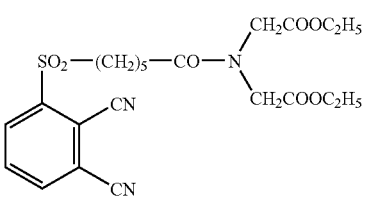
Ia-33
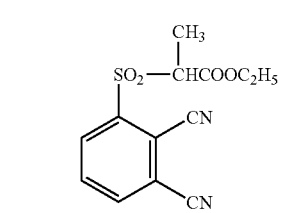
Ia-34
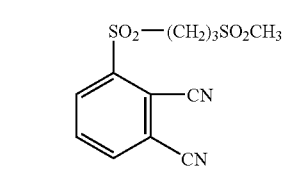
Ia-35
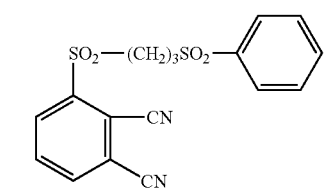
Ia-36
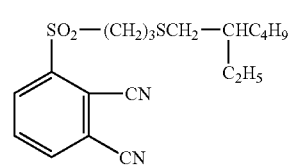

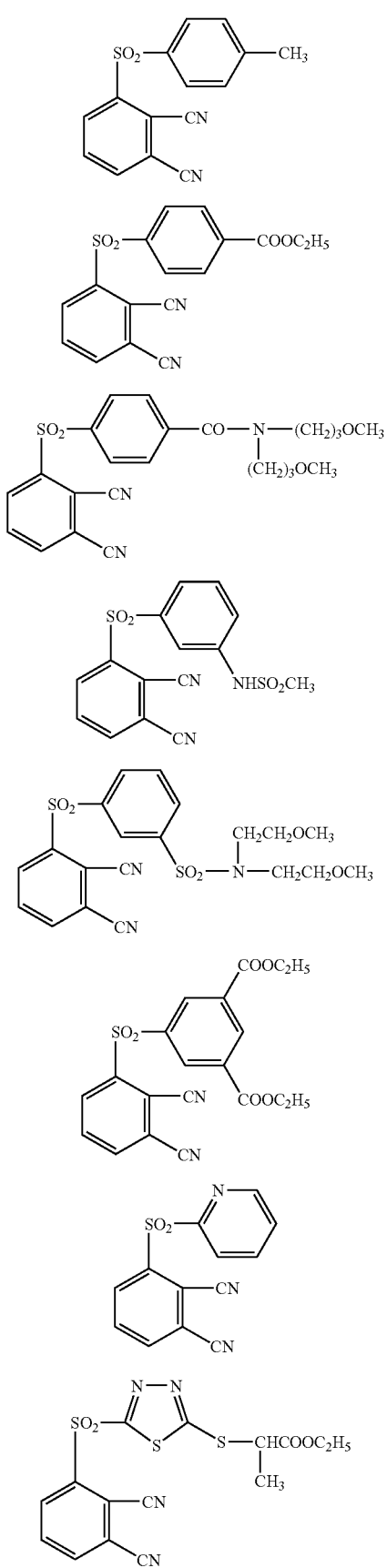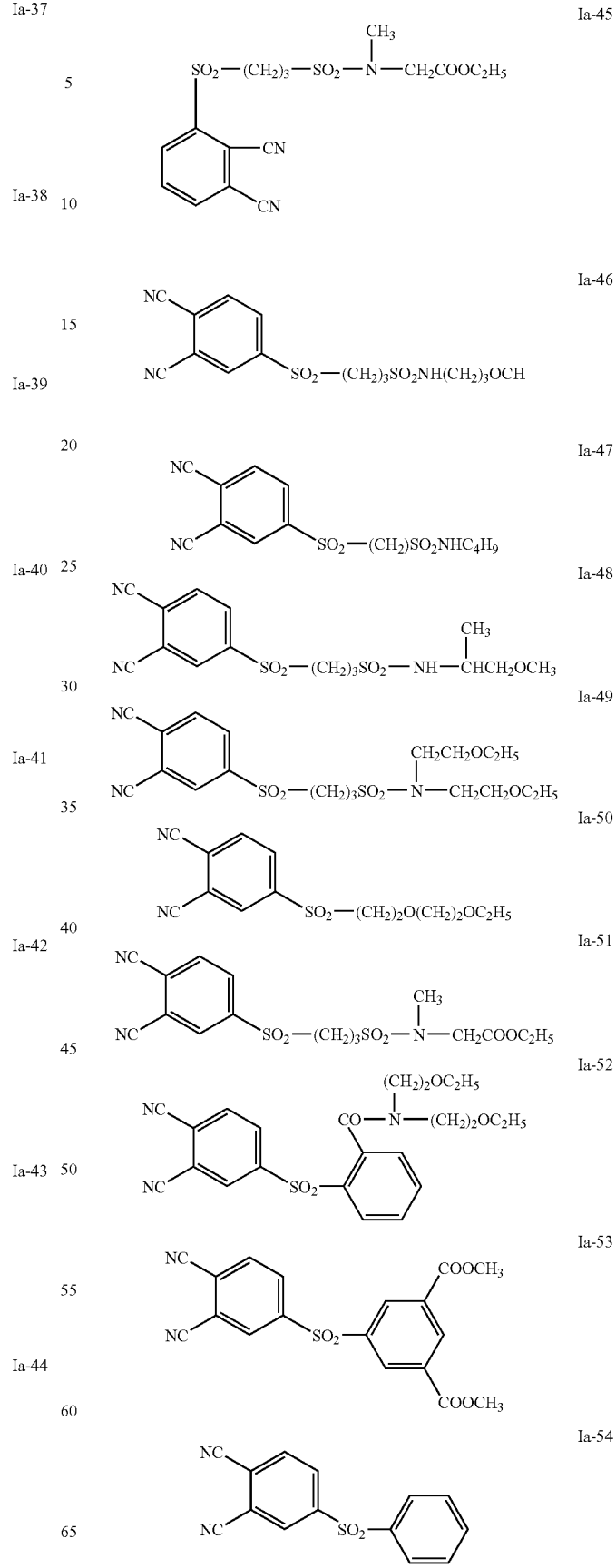

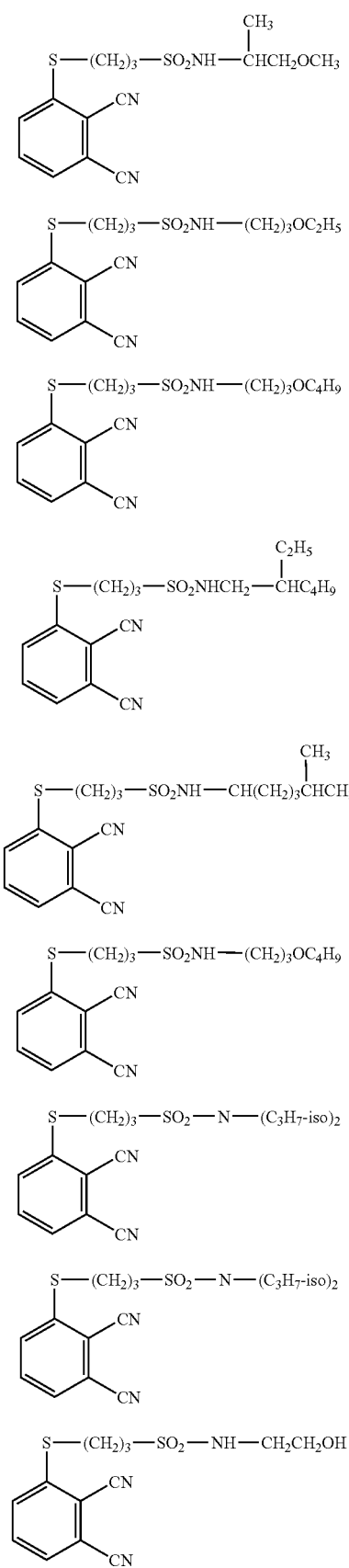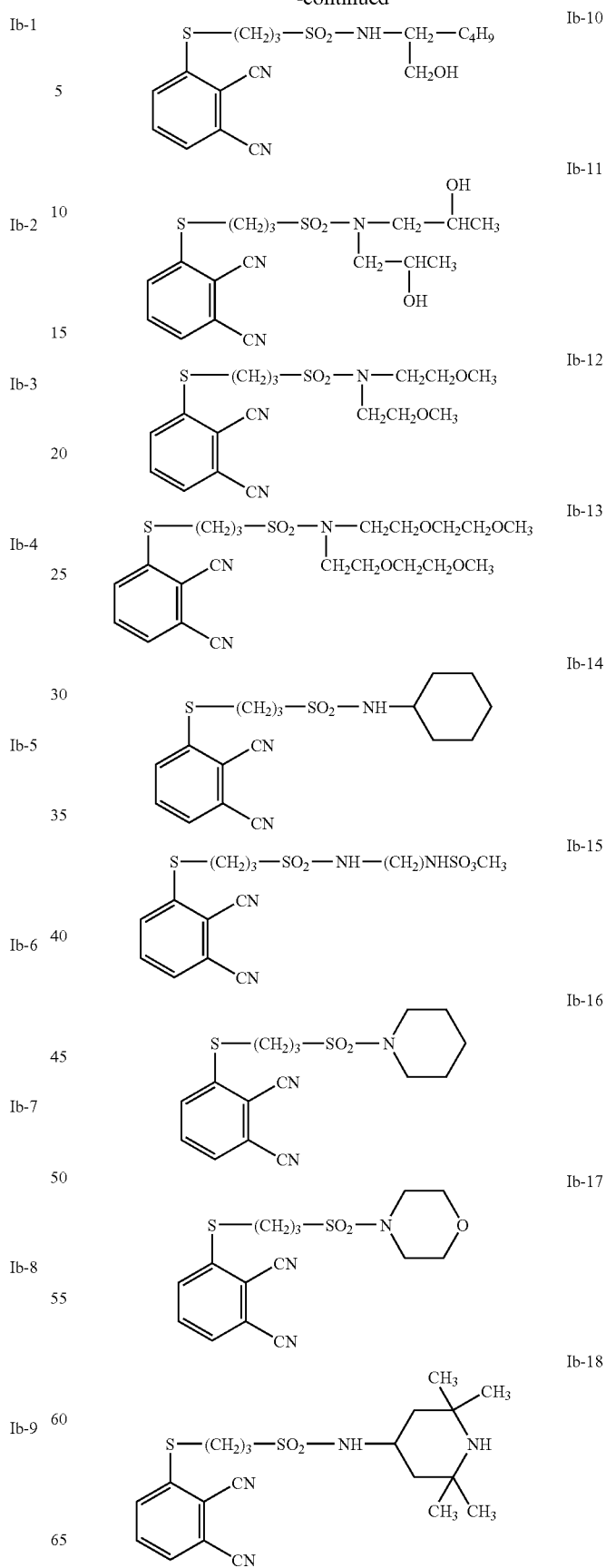

Ib-19 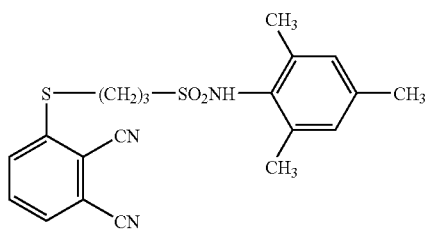
Ib-20 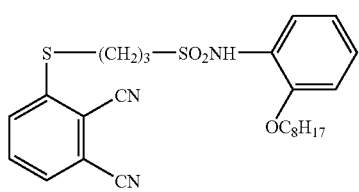
Ib-21 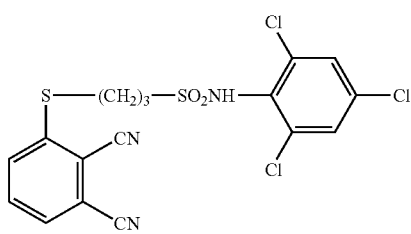
Ib-22 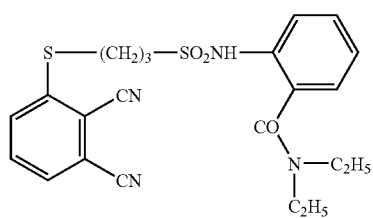
Ib-23 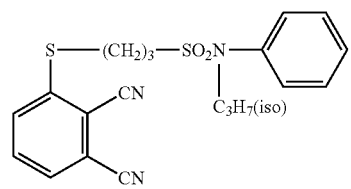
Ib-24 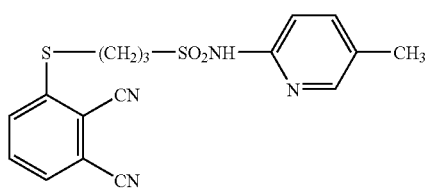
Ib-25 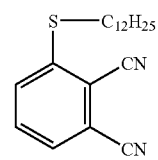
Ib-26 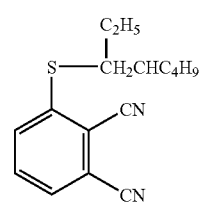
Ib-27 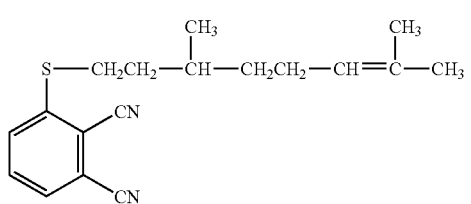
Ib-28 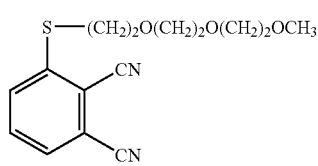
Ib-29 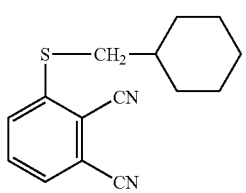
Ib-30 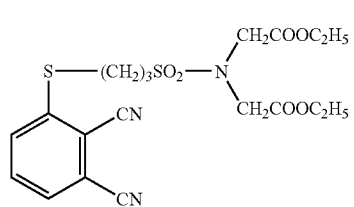
Ib-31 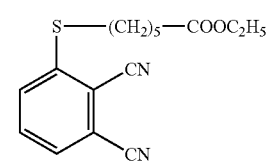
Ib-32 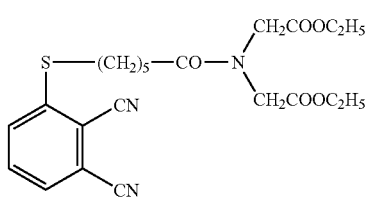
Ib-33 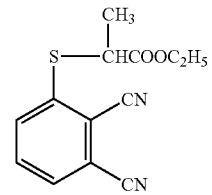
Ib-34 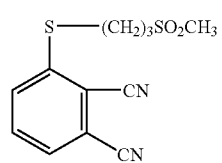

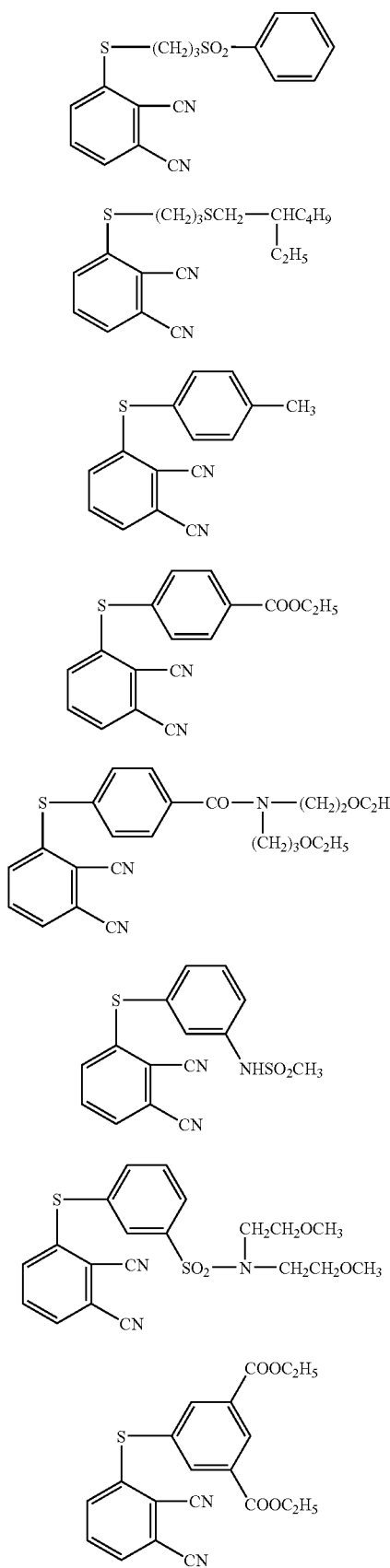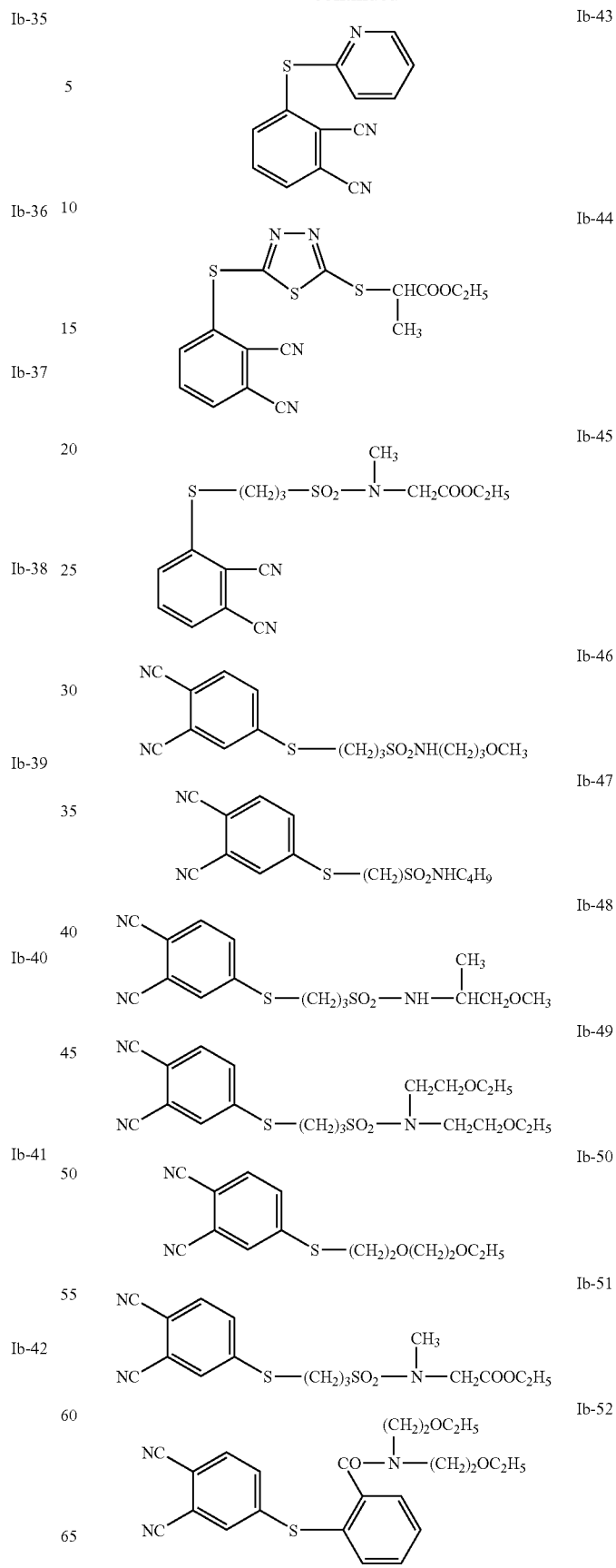

Ib-53 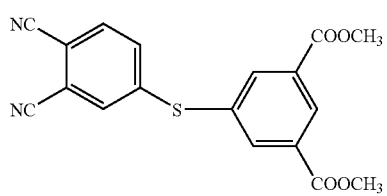
Ib-54 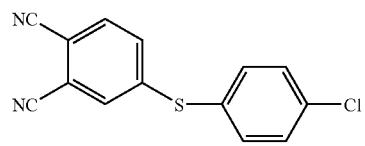
Ic-1 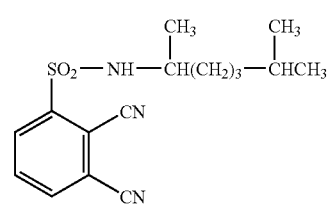
Ic-2 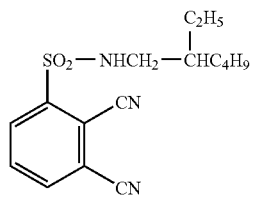
Ic-3 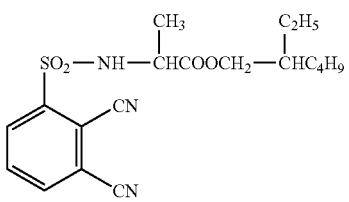
Ic-4 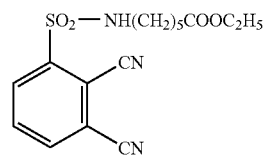
Ic-5 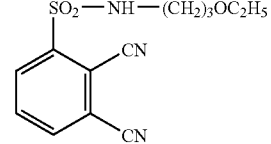
Ic-6 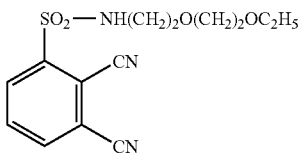
Ic-7 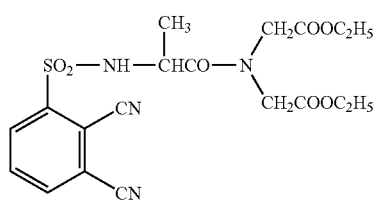
Ic-8 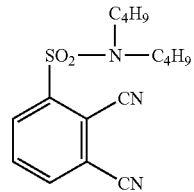
Ic-9 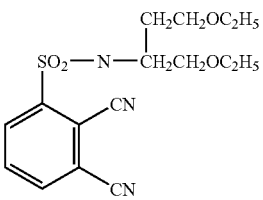
Ic-10 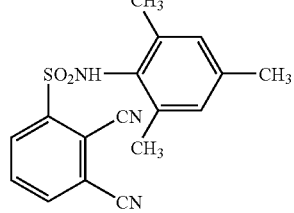
Ic-11 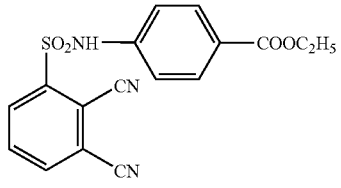
Ic-12 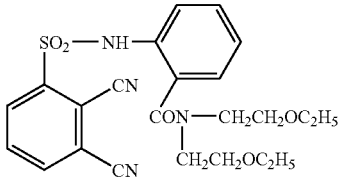
Ic-13 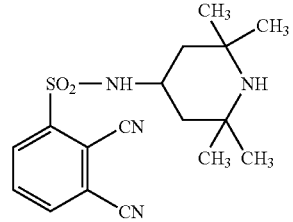
Ic-14 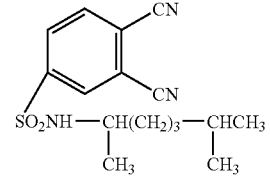
Ic-15 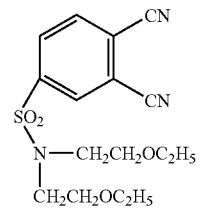

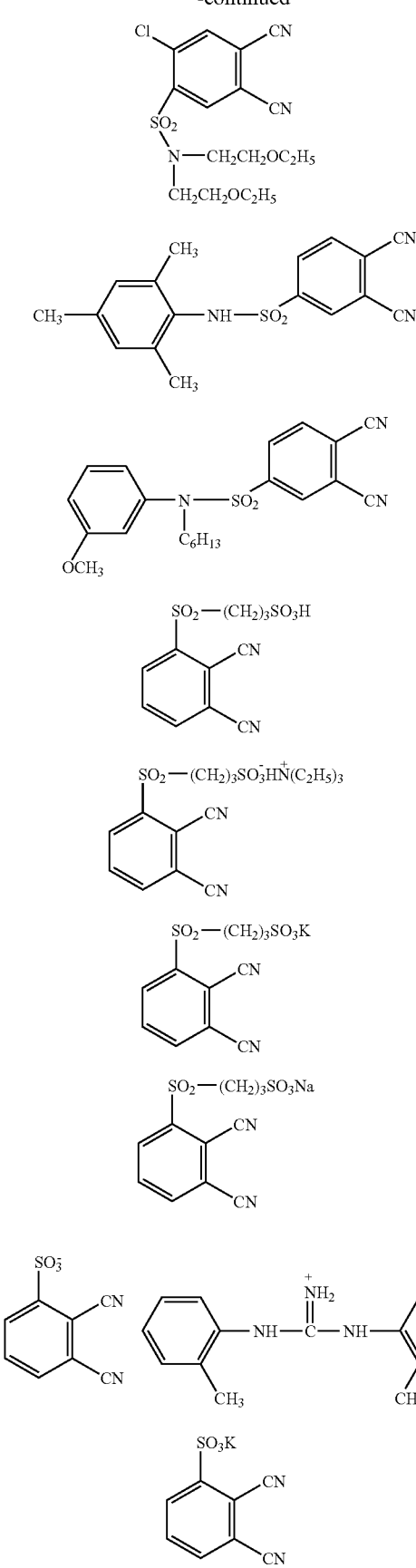
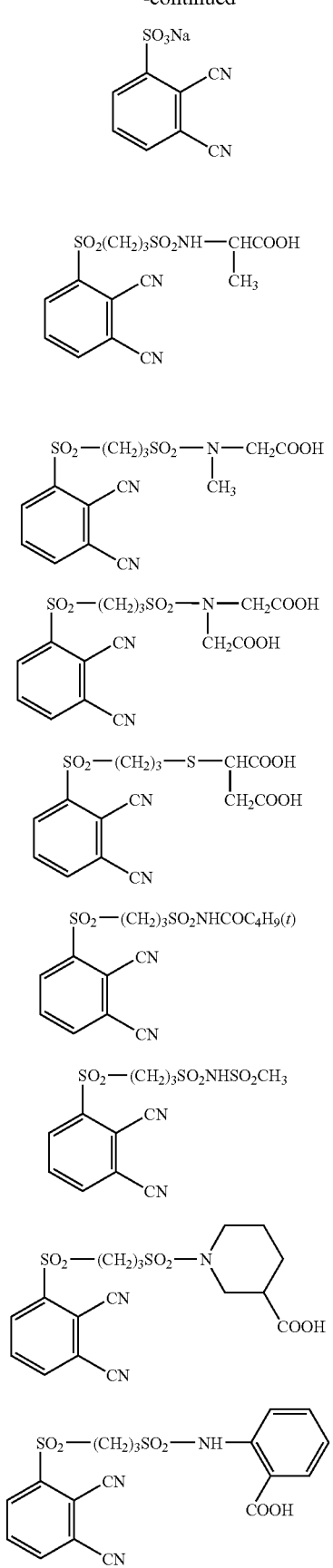

-continued
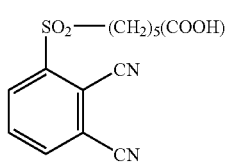
IIa-16
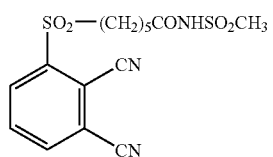
IIa-17
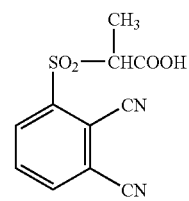
IIa-18
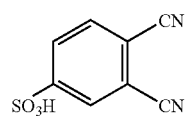
IIa-19
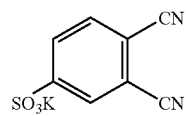
IIa-20
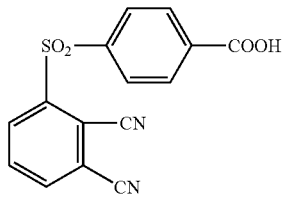
IIa-21
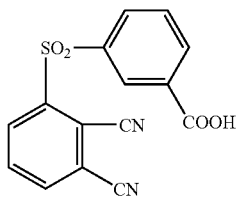
IIa-22
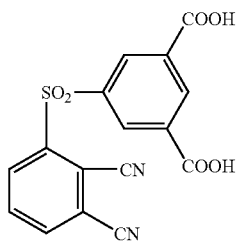
IIa-23
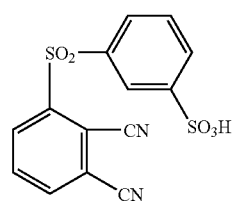
IIa-24
-continued
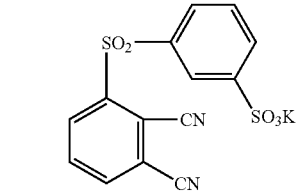
IIa-25
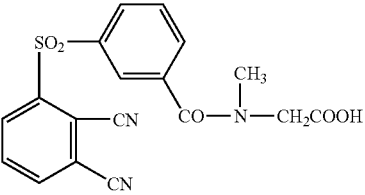
IIa-26
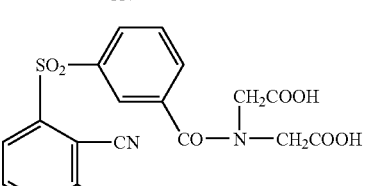
IIa-27
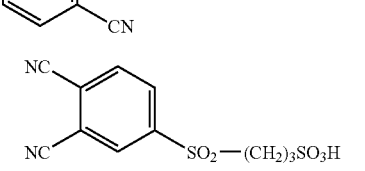
IIa-28
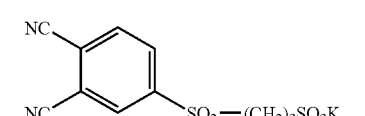
IIa-29
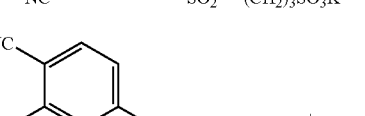
IIa-30
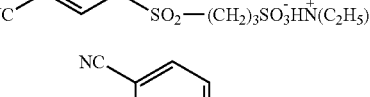
IIa-31
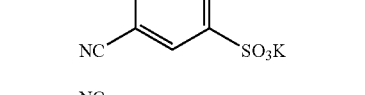
IIa-32
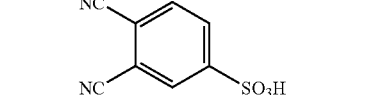
IIa-33
IIa-34
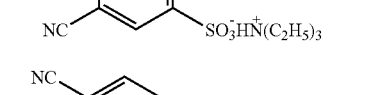
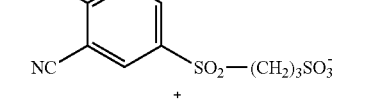
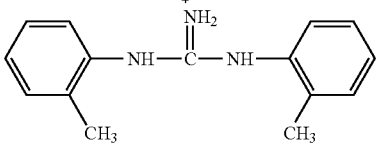

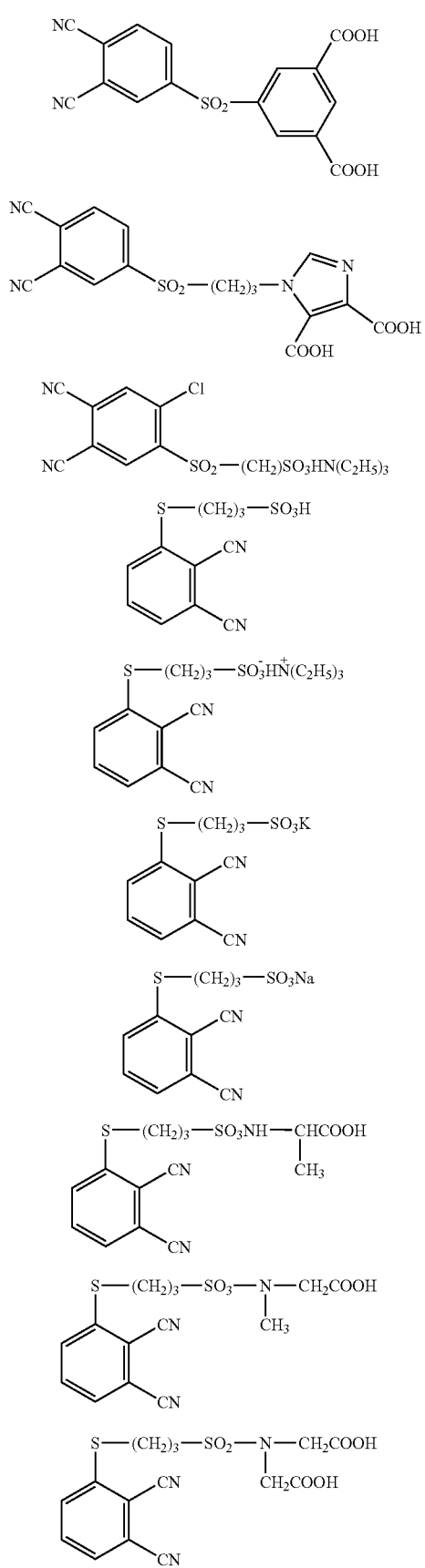

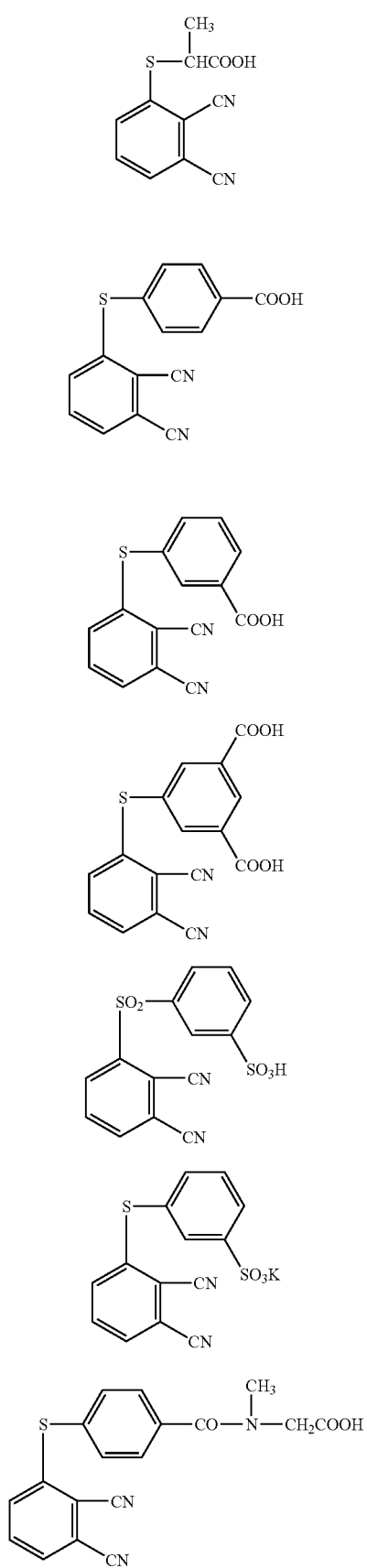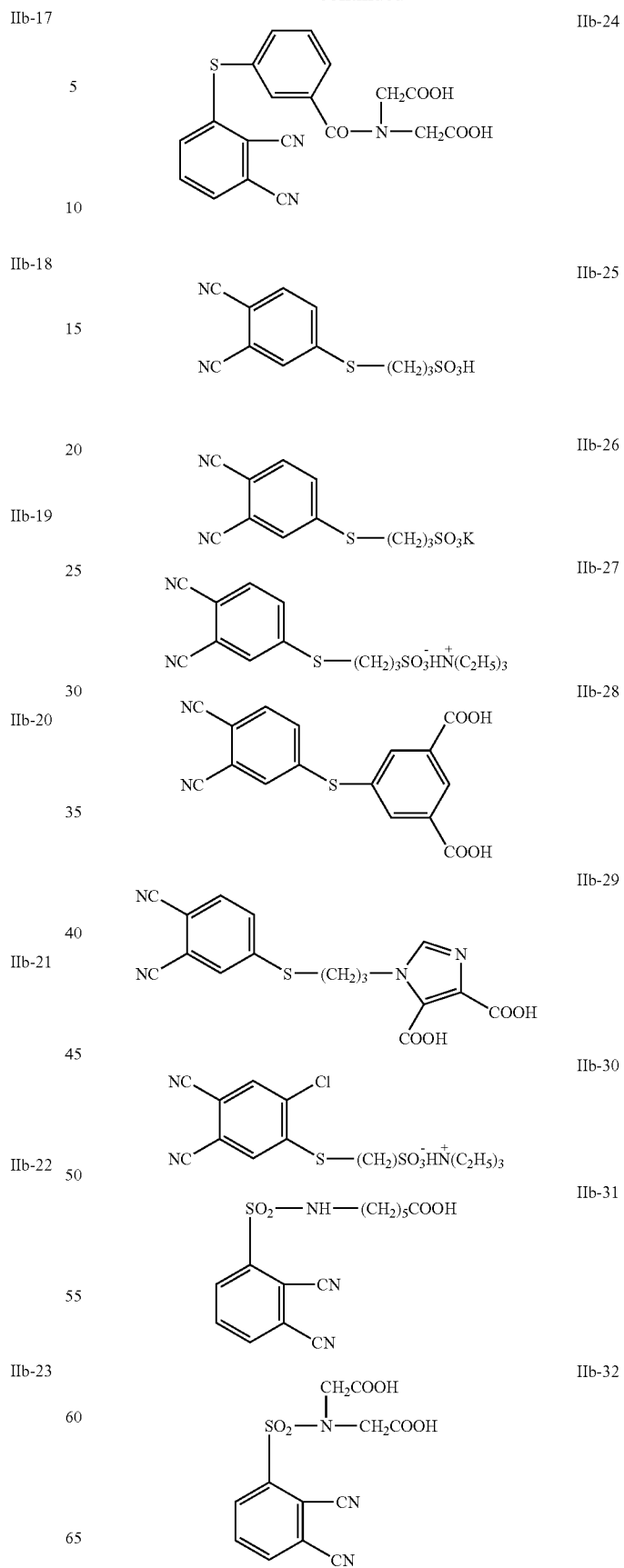

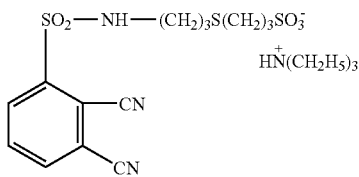
IIb-33

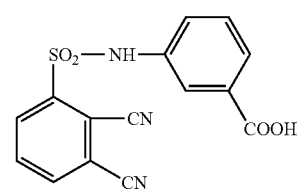
II-b34

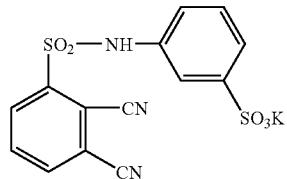
IIb-35

Next, specific examples of the metal phthalocyanine dye mixture formed from phthalonitrile, the compound represented by the formula (I), the compound represented by the formula (II), and a metal or metal compound are shown below. However, since the metal phthalocyanine dye of the invention has a complicated mixture (in terms of compositional ratios, isomer ratios based on the substitution positions, or the like), the compositional ratio determined as an average of the phthalonitrile, the compound represented by the formula (I) and the compound represented by the formula (II) is denoted.

Since the dye mixture of the invention is a complicated mixture, the solubility in an organic solvent is excellent, and also, the dye mixture can have lower molecular weights, which makes it possible to obtain a thin film of the color filter.

| Dye mixture Compound No. | Molar ratio of phthalonitrile | Exemplary compound No. represented by formula (I) Numerical values in parenthesis indicate molar ratios. | Exemplary compound No. represented by formula (II) Numerical values in parenthesis indicate molar ratios. | Metal atom (Y) |
|---|---|---|---|---|
| Ca-1 | 1 | Ia-1 (2.0) | IIa-1 (1.0) | Cu |
| Ca-2 | 1.25 | Ia-1 (2.0) | IIa-1 (0.75) | Cu |
| Ca-3 | 1.5 | Ia-1 (2.0) | IIa-1 (0.5) | Cu |
| Ca-4 | 1 | Ia-1 (2.0) | IIa-2 (1.0) | Cu |
| Ca-5 | 1.25 | Ia-1 (2.0) | IIa-2 (0.75) | Cu |
| Ca-6 | 1.5 | Ia-1 (2.0) | IIa-2 (0.5) | Cu |
| Ca-7 | 1.5 | Ia-1 (2.0) | IIa-3 (0.5) | Cu |
| Ca-8 | 1 | Ia-1 (2.0) | IIa-5 (1.0) | Cu |
| Ca-9 | 1 | Ia-1 (2.0) | IIa-6 (1.0) | Cu |
| Ca-10 | 1 | Ia-1 (2.0) | IIa-8 (1.0) | Cu |
| Ca-11 | 1 | Ia-1 (2.0) | IIa-9 (1.0) | Cu |
| Ca-12 | 1 | Ia-1 (2.0) | IIa-10 (1.0) | Cu |
| Ca-13 | 1.5 | Ia-1 (2.0) | IIa-10 (0.5) | Cu |
| Ca-14 | 1 | Ia-1 (2.0) | IIa-11 (1.0) | Cu |
| Ca-15 | 1 | Ia-1 (2.0) | IIa-12 (1.0) | Cu |
| Ca-16 | 1 | Ia-1 (2.0) | IIa-17 (1.0) | Cu |
| Ca-17 | 1 | Ia-1 (2.0) | IIa-20 (1.0) | Cu |
| Ca-18 | 1 | Ia-1 (2.0) | IIa-23 (1.0) | Cu |
| Ca-19 | 1 | Ia-1 (2.0) | IIa-29 (1.0) | Cu |
| Ca-20 | 1 | Ia-1 (2.0) | IIa-30 (1.0) | Cu |
| Ca-21 | 1 | Ia-1 (2.0) | IIa-33 (1.0) | Cu |
| Ca-22 | 1 | Ia-2 (2.0) | IIa-2 (1.0) | Cu |
| Ca-23 | 1.25 | Ia-2 (2.0) | IIa-2 (0.75) | Cu |
| Ca-24 | 1.25 | Ia-4 (2.0) | IIa-2 (0.75) | Cu |
| Ca-25 | 1.25 | Ia-5 (2.0) | IIa-2 (0.75) | Cu |
| Ca-26 | 1.25 | Ia-12 (2.0) | IIa-2 (0.75) | Cu |
| Ca-27 | 1.25 | Ia-18 (2.0) | IIa-2 (0.75) | Cu |
| Ca-28 | 1.25 | Ia-19 (2.0) | IIa-2 (0.75) | Cu |
| Ca-29 | 1.25 | Ia-28 (2.0) | IIa-2 (0.75) | Cu |
| Ca-30 | 1.25 | Ia-39 (2.0) | IIa-2 (0.75) | Cu |
| Ca-31 | 1 | Ia-48 (2.0) | IIa-2 (1.0) | Cu |
| Ca-32 | 1 | Ia-48 (2.0) | IIa-27 (1.0) | Cu |
| Ca-33 | 1 | Ia-48 (2.0) | IIa-30 (1.0) | Cu |
| Ca-34 | 1 | Ia-48 (2.0) | IIa-33 (1.0) | Cu |
| Ca-35 | 1.25 | Ia-1 (1.75) | IIa-1 (1.0) | Cu |
| Ca-36 | 1.5 | Ia-1 (1.5) | IIa-1 (1.0) | Cu |
| Ca-37 | 1 | Ia-1 (1.5) | IIa-1 (1.5) | Cu |
| Ca-38 | 1.5 | Ia-13 (1.5) | IIa-1 (1.0) | Cu |
| Ca-39 | 1 | Ia-1 (2.0) | IIa-2 (1.0) | Zn |
| Ca-40 | 1 | Ia-1 (2.0) | IIa-2 (1.0) | Co |
| Ca-41 | 1 | Ia-1 (2.0) | IIa-2 (1.0) | V=O |
| Cb-1 | 1 | Ib-1 (2.0) | IIb-2 (1.0) | Cu |
| Cb-2 | 1.25 | Ib-1 (2.0) | IIb-2 (0.75) | Cu |
| Cb-3 | 1 | Ib-12 (2.0) | IIb-2 (1.0) | Cu |

| Dye mixture Compound No. | Molar ratio of phthalonitrile | Exemplary compound No. represented by formula (I) Numerical values in parenthesis indicate molar ratios. | Exemplary compound No. represented by formula (II) Numerical values in parenthesis indicate molar ratios. | Metal atom (Y) |
|---|---|---|---|---|
| Cb-4 | 1 | Ib-13 (2.0) | IIb-2 (1.0) | Cu |
| Cb-5 | 1.5 | Ib-13 (1.5) | IIb-2 (1.0) | Cu |
| Cb-6 | 1 | Ib-18 (2.0) | IIb-2 (1.0) | Cu |
| Cb-7 | 1 | Ib-39 (2.0) | IIb-2 (1.0) | Cu |
| Cb-8 | 1.25 | Ib-39 (2.0) | IIb-2 (0.75) | Cu |
| Cb-9 | 1.5 | Ib-39 (2.0) | IIb-2 (0.5) | Cu |
| Cb-10 | 1 | Ib-1 (2.0) | IIb-6 (1.0) | Cu |
| Cb-11 | 1 | Ib-1 (2.0) | IIb-7 (1.0) | Cu |
| Cb-12 | 1 | Ib-1 (2.0) | IIb-15 (1.0) | Cu |
| Cb-13 | 1 | Ib-1 (2.0) | IIb-18 (1.0) | Cu |
| Cb-14 | 1 | Ib-39 (2.0) | IIa-5 (1.0) | Cu |
| Cb-15 | 1 | Ib-39 (2.0) | IIa-6 (1.0) | Cu |
| Cb-16 | 1 | Ib-39 (2.0) | IIb-7 (1.0) | Cu |
| Cb-17 | 1.25 | Ib-39 (2.0) | IIb-7 (0.75) | Cu |
| Cb-18 | 1 | Ib-39 (2.0) | IIb-18 (1.0) | Cu |
| Cb-19 | 1.25 | Ib-39 (2.0) | IIb-18 (0.75) | Cu |
| Cb-20 | 1 | Ib-39 (2.0) | IIb-23 (1.0) | Cu |
| Cb-21 | 1.25 | Ib-39 (2.0) | IIb-23 (0.75) | Cu |
| Cb-22 | 1.5 | Ib-39 (1.5) | IIb-24 (1.0) | Cu |
| Cb-23 | 1 | Ib-51 (2.0) | IIb-27 (1.0) | Cu |
| Cb-24 | 1 | Ib-52 (2.0) | IIa-6 (1.0) | Cu |
| Cc-1 | 1 | Ic-1 (2.0) | IIa-2 (1.0) | Cu |
| Cc-2 | 1 | Ic-1 (2.0) | IIa-3 (1.0) | Cu |
| Cc-3 | 1 | Ic-1 (2.0) | IIa-5 (1.0) | Cu |
| Cc-4 | 1 | Ic-1 (2.0) | IIa-10 (1.0) | Cu |
| Cc-5 | 1 | Ic-1 (2.0) | IIa-21 (1.0) | Cu |
| Cc-6 | 1 | Ic-1 (2.0) | IIa-26 (1.0) | Cu |
| Cc-7 | 1 | Ic-9 (2.0) | IIa-2 (1.0) | Cu |
| Cc-8 | 1 | Ic-15 (2.0) | IIa-2 (1.0) | Cu |

The method for producing the dye mixture of the invention will be described.

Synthesis Example 1

(Synthesis of Exemplary Dye Mixture Ca-1)

Synthesis was carried out according to the reaction scheme shown below.

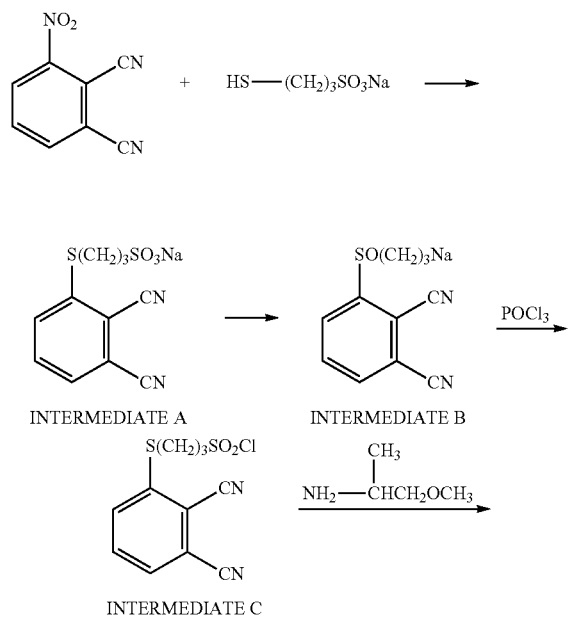

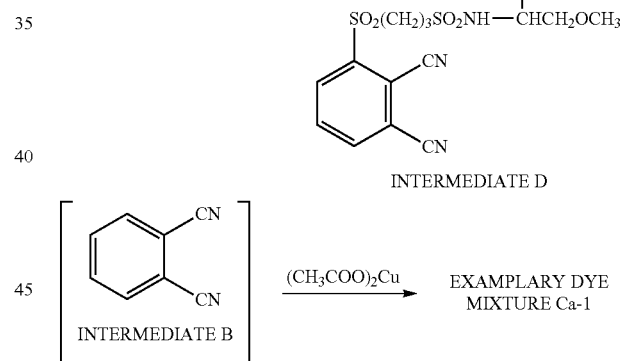

(Synthesis of Intermediate B)

Synthesis was carried out according to the method described in JP-A No. 2006-124379.

(Synthesis of Intermediate C)

To 150 g (0.446 mole) of the intermediate B synthesized by the method described in JP-A No. 2006-124379 was added 450 ml of acetonitrile, followed by heating and stirring at 70 to 75° C. To this dispersion was added dropwise 82 ml of phosphorous oxychloride. After completion of dropwise addition, the mixture was stirred at 70 to 75° C. for 3 hours. After completion of the reaction, the mixture was cooled to room temperature (25° C.) and then poured into 3500 ml of water under stirring. The deposited crystal was filtered and washed with water. This crystal was dispersed in 600 ml of 2-propanol at room temperature (25° C.). This crystal was filtered and dried to obtain 140 g (yield: 94.3% by mass) of an intermediate C.

(Synthesis of Intermediate D)

To 60 g (0.18 mole) of the intermediate C obtained in the above method was added 300 ml of acetonitrile, followed by cooling to 5° C. to 10° C. and stirring. To this dispersion was added dropwise 32.1 g (0.36 mole) of 1-methoxy-2-propylamine. After dropwise addition, the mixture was stirred at room temperature (25° C.) for 2 hours. This reaction liquid was poured into 1500 ml of water under stirring, and a 35% by mass aqueous hydrochloric acid was added thereto to adjust the pH to 6. Thereafter, 50 ml of ethyl acetate was added to carry out the extraction. This ethyl acetate solution was washed with saturated saline and then dried over anhydrous magnesium sulfate. Thereafter, ethyl acetate was evaporated under reduced pressure. To the residue was added 200 ml of methanol to deposit the crystal. This crystal was filtered and dried to obtain 54 g (yield: 77.9% by mass) of an intermediate D.

(Synthesis of Exemplary Dye Mixture Ca-1)

To 2.56 g (0.02 mole) of phthalonitrile, 6.73 g (0.02 mole) of the intermediate B, and 15.4 g (0.04 mole) of the intermediate D were added 60 ml of diethylene glycol and 120 ml of 2-methylpropanol, followed by heating at 90° C. to 100° C. under stirring. To this solution was added 11.1 g of ammonium benzoate. Then, 3.63 g (0.02 mole) of copper acetate was added thereto. After completion of the addition, the mixture was stirred at 100° C. to 110° C. for 6 hours to carry out the reaction. After completion of the reaction, this reaction liquid was cooled to 60° C., and 30 ml of methanol and 30 ml of N-methylpyrrolidone were added thereto, followed by stirring. This solution was poured into aqueous hydrochloric acid (100 ml of a 35% by mass hydrochloric acid and 1200 ml of water). The deposited crystal was filtered, washed with water until it was neutralized, and then dried. This crystal was dissolved in 500 ml of methanol and filtered, and the insolubles were filtered. This filtrate was concentrated under reduced pressure and solidified by drying to obtain 11.5 g (yield: 88.5% by mass) of an exemplary dye mixture Ca-1.

The maximum absorption wavelength ($\lambda$max) in the chloroform solution was 662.3 nm and the molar absorption coefficient ($\epsilon$) was 118000 in terms of an average molecular weight.

Synthesis Example 2

(Synthesis of Exemplary Dye Mixture Cb-18)

Synthesis was carried out according to the reaction scheme shown below.

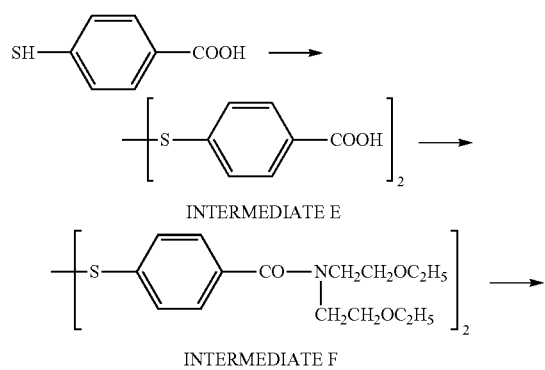

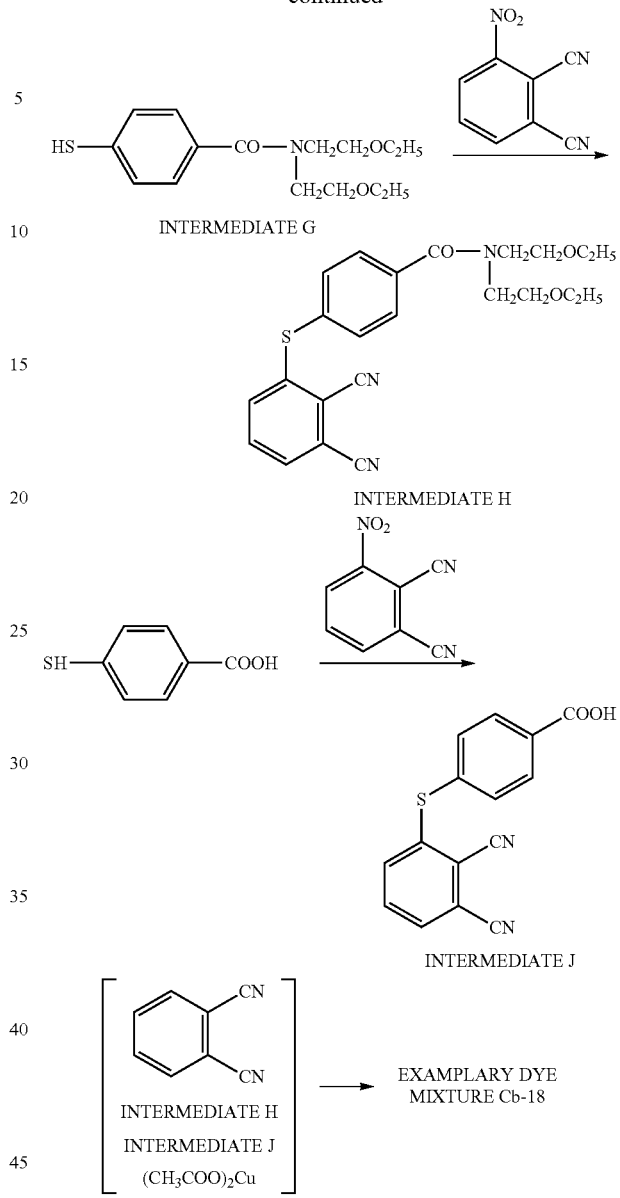

(Synthesis of Intermediate H)

Synthesis of the intermediate H was carried out in accordance with the method described in JP-A No. 2006-47497.

(Synthesis of Intermediate J)

25 g (0.144 mole) of 3-nitrophthalonitrile and 22.4 g (0.145 mole) of 4-mercaptobenzoic acid were dissolved in 125 ml of N-methylpyrrolidone, followed by stirring at room temperature (20 to 28° C.). To this solution was added portionwise 30.7 g of sodium carbonate. After completion of the addition, the reaction liquid was heated at 40° C. to 45° C., followed by stirring for 2 hours to complete the reaction. This reaction liquid was poured into 1000 ml of water under stirring, and then a 35% by mass aqueous hydrochloric acid was added thereto adjust the pH to 3. The deposited crystal was filtered, washed with water, and dried. This crystal was dispersed in 300 ml of methanol, followed by stirring. This crystal was filtered and dried to obtain 35.5 g (yield: 88.0% by mass) of an intermediate J.

(Synthesis of Exemplary Dye Mixture Cb-18)

To 1.28 g (0.01 mole) of phthalonitrile, 8.47 g (0.02 mole) of the intermediate H obtained by the above method, and 2.80 g (0.01 mole) of the intermediate J obtained by the above method, were added 30 ml of diethylene glycol and 100 ml of 2-methylpropanol, followed by heating to 95° C. to 100° C. and stirring. To this solution was added 5.57 g of ammonium benzoate, and then 1.82 g (0.01 mole) of copper acetate was added thereto. This reaction liquid was heated at 100° C. to 110° C. to carry out the reaction for 6 hours. After completion of the reaction, the mixture was cooled to 60° C., and then, to this reaction liquid were added 60 ml of N-methylpyrrolidone and 60 ml of methanol, followed by stirring. Then, this reaction liquid was poured into aqueous hydrochloric acid (in which 60 ml of a 35% by mass aqueous hydrochloric acid had been diluted in 700 ml of water) under stirring. The deposited crystal was filtered, washed with water, and dried. This crystal was dissolved in a solution of 200 ml of methanol and 200 ml of acetone, and the insolubles were removed by filtration. The filtrate was concentrated under reduced pressure and solidified by drying to obtain 12.7 g (yield: 96.3% by mass) of an exemplary dye mixture Cb-18. The λmax and ϵ in the ethyl acetate solution were 652.0 nm and 52600, respectively.

<<Curable Composition>>

The curable composition of the invention includes the metal phthalocyanine dye mixture of the invention, and preferably includes a radiation-sensitive compound and polymerizable monomers. Further, generally, it may further include a solvent, and if necessary, other components such as a crosslinking agent, and the like. The curable composition of the invention can attain the characteristics of high sensitivity, high resolution, and high transmittance ratio by using the compound of the invention.

If the curable composition of the invention contains the metal phthalocyanine dye mixture of the invention, the content of the metal phthalocyanine dye mixture varies depending on each molar absorption coefficient and required spectral characteristics, film thickness, or the like, but it is preferably from 1% by mass to 80% by mass, and more preferably from 10% by mass to 70% by mass, based on the entire solid contents of the curable composition in the invention.

The metal phthalocyanine dye mixtures of the invention may be singly contained in the curable composition of the invention, or may be used in combination of two or more kinds thereof.

For the curable composition of the invention, and a color filter using the curable composition, other coloring materials having a λmax at 400 nm to 600 nm may be used in addition to the metal phthalocyanine dye mixture of the invention, and known azo dyes, methine dyes, azomethine dyes, quinophthalone-based dyes, xanthene-based dyes, dioxadine-based dyes, dipyrromethene complex-based dyes, or the like may be used.

<Binder>

It is preferable that the curable composition of the invention contain at least one kind of the binder. The binder according to the invention is not particularly limited as long as it is soluble in an alkali. However, it is preferable that the binder be selected from the viewpoints of heat resistance, developability, availability, or the like.

The alkali-soluble binder is preferably a linear organic high molecular weight polymer that is soluble in an organic solvent and developable with a weak alkali aqueous solution. Examples of the linear organic high molecular weight polymer include a polymer having a carboxylic acid on a side chain, such as a methacrylic acid copolymer, an acrylic acid copolymer, an itaconic acid copolymer, a crotonic acid copolymer, a maleic acid copolymer, a partially esterified maleic acid copolymer, and the like, described, for example, in JP-A No. 59-44615, Japanese Patent Application Publication (JP-B) Nos. 54-34327, 58-12577, and 54-25957, JP-A Nos. 59-53836 and 59-71048, and the like, and particularly, an acidic cellulose derivative having a carboxylic acid on a side chain is useful. In addition to the above, a polymer obtained by reacting an acid anhydride with a polymer having a hydroxyl group, a polyhydroxystyrene-based resin, a polysiloxane-based resin, poly(2-hydroxyethyl(meth)acrylate), polyvinylpyrrolidone, polyethyleneoxide, polyvinyl alcohol, and the like are also useful.

Furthermore, the alkali-soluble binder may be produced by copolymerizing monomers having hydrophilic groups. Examples thereof include alkoxyalkyl(meth)acrylate, hydroxyalkyl(meth)acrylate, glycerol(meth)acrylate, (meth)acrylamide, N-methylol acrylamide, secondary or tertiary alkyl acrylamide, dialkylaminoalkyl(meth)acrylate, morpholine(meth)acrylate, N-vinylpyrrolidone, N-vinylcaprolactam, vinylimidazole, vinyltriazole, methyl(meth)acrylate, ethyl(meth)acrylate, branched or straight chain propyl (meth)acrylate, branched or straight chain butyl(meth)acrylate, phenoxyhydroxypropyl(meth)acrylate, and the like.

Furthermore, a monomer having a tetrahydrofurfuryl group, a phosphoric acid, phosphate ester, a quaternary ammonium salt, an ethyleneoxy chain, a propyleneoxy chain, a sulfonic acid or a salt thereof, a morpholinoethyl group, or the like is also useful as the monomer having a hydrophilic group.

Moreover, in order to improve the crosslinking efficiency, a polymerizable group may be included in the side chain, and polymers and the like which contain an allyl group, a (meth)acryl group, an allyloxyalkyl group, or the like in the side chain thereof are also useful.

Examples of the polymer having a polymerizable group include KS RESIST-106 (manufactured by Osaka Organic Chemical Industry Ltd.), CYCLOMER P series (manufactured by Daicel Chemical Industries, Ltd.), and the like.

In addition, in order to enhance the strength of a cured film, alcohol-soluble nylon, a polyether formed from 2,2-bis-(4-hydroxyphenyl)-propane and epichlorohydrine, and the like are also useful.

Among these various binders, preferable examples of the binder according to invention include a polyhydroxystyrene-based resin, a polysiloxane-based resin, an acryl-based resin, an acrylamide-based resin, and an acryl/acrylamide copolymer resin. In addition, from the viewpoint of control of developability, an acryl-based resin, an acrylamide-based resin, and an acryl/acrylamide copolymer resin are preferable. As the acryl-based resin, a copolymer consisting of monomers selected from a benzyl(meth)acrylate, a methacryl acid, hydroxyethyl(meth)acrylate, (meth)acrylamide, and the like, and KS RESIST-106 (manufactured by Osaka Organic Chemical Industry Ltd.), CYCLOMER P series, and the like are preferable.

In addition, as the binder to be used in the invention, an alkali-soluble phenolic resin can be used. The alkali-soluble phenolic resin may be preferably used when the curable composition of the invention is formed of a positive working composition. Examples of the alkali-soluble phenolic resin include a novolak resin, a vinyl polymer, and the like.

Examples of the novolak resin include those obtained by condensing phenols and aldehydes in the presence of an acidic catalyst. Examples of the phenols include phenol, crezol, ethyl phenol, butyl phenol, xylenol, phenyl phenol, catechol, rezorcinol, pyrogallol, naphthol, bisphenol A, and the like.

Examples of the aldehydes include formaldehyde, paraformaldehyde, acetaldehyde, propynoic aldehyde, benzaldehyde, and the like.

The phenols and the aldehydes may be used singly or in combination of two or more kinds thereof.

Specific examples of the novolak resin include a condensation product of metacrezol, paracrezol, or a mixture of these and formalin.

A molecular weight distribution of the novolak resin may be adjusted by means such as fractionation and the like. In addition, a low-molecular weight component having a phenolic hydroxyl group, such as bisphenol C, bisphenol A, and the like, may be mixed with the above-mentioned novolak resin.

The weight-average molecular weight (value measured by a GPC method using a polystyrene as a standard) of the binder is preferably from 1000 to $2 \times 10^5$, more preferably from 2000 to $1 \times 10^5$, and particularly preferably from 5000 to $5 \times 10^4$.

The amount of the binder to be used in the curable composition of the invention is preferably from 10% by mass to 90% by mass, more preferably from 20% by mass to 80% by mass, and particularly preferably from 30% by mass to 70% by mass, based on the entire solid contents of the curable composition of the invention.

<Crosslinking Agent>

It is well-known regarding the invention that the curable composition of the invention has a high light absorption coefficient, which can be used to form a thin layer, as well as excellent fastness in comparison with conventional ones, but a crosslinking agent can be additionally used to obtain a further highly cured film.

The crosslinking agent is not particularly limited as long as it can conduct film curing by a crosslinking reaction, and examples thereof include (a) an epoxy resin, (b) a melamine compound, a guanamine compound, a glycoluryl compound, or a urea compound, which is substituted with at least one substituent selected from a methylol group, an alkoxymethyl group, and an acyloxymethyl group; and (c) a phenol compound, a naphthol compound, or a hydroxyanthracene compound, which is substituted with at least one substituent selected from a methylol group, an alkoxymethyl group, and an acyloxymethyl group. Among these, particularly preferred is a polyfunctional epoxy resin.

The (a) epoxy resin is not particularly limited as long as it has an epoxy group and a crosslinking property. Examples thereof include divalent glycidyl group-containing low molecular compounds, such as bisphenol-A-diglycidyl ether, ethylene glycol diglycidyl ether, butanediol diglycidyl ether, hexanediol diglycidyl ether, dihydroxybiphenyl diglycidyl ether, diglycidyl ester phthalate, N,N-diglycidylaniline, and the like, trivalent glycidyl group-containing low molecular compounds, such as trimethylolpropane triglycidyl ether, trimethylolphenol triglycidyl ether, Tris P-PA triglycidyl ether, and the like, tetravalent glycidyl group-containing low molecular compounds, such as pentaerythritol tetraglycidyl ether, tetramethylolbisphenol-A-tetraglycidyl ether, and the like, polyvalent glycidyl group-containing low molecular compounds, such as dipentaerythritol pentaglycidyl ether, dipentaerythritol hexaglycidyl ether, and the like, and glycidyl group-containing polymer compounds, such as polyglycidyl(meth)acrylate, an adduct obtained by adding 1,2-epoxy-4-(2-oxyranyl)cyclohexane to 2,2-bis(hydroxymethyl)-1-butanol, and the like, and others.

The crosslinking agent (b), i.e., the melamine compound, guanamine compound, glycoluryl compound, or urea compound substituted with at least one group selected from a methylol group, an alkoxymethyl group, and an acyloxymethyl group prevents intermixing with an overcoated photoresist, and also further increases the film strength by thermal crosslinking.

Hereinafter, (b) the melamine compound, the guanamine compound, the glycoluryl compound, and the urea compound may be collectively referred to as the compound (methylol group-containing compound, alkoxy methyl group-containing compound, or acyloxymethyl group-containing compound) according to (b) in some cases.

The number of methylol groups, alkoxymethyl groups and acyloxymethyl groups contained for substitution in the crosslinking agent (b) is from 2 to 6 in the case of a melamine compound, and from 2 to 4 in the case of a glycoluryl compound, a guanamine compound or an urea compound, and preferably, the number is from 5 to 6 in the case of a melamine compound, and from 3 to 4 in the case of a glycoluryl compound, a guanamine compound or an urea compound.

The methylol group-containing compound according to (b) may be obtained by heating the alkoxy methyl group-containing compound according to (b) in alcohol in the presence of an acidic catalyst such as hydrochloric acid, sulfuric acid, nitric acid, methanesulfonic acid, and the like. The acyloxymethyl group-containing compound according to (b) can be obtained by mixing and stirring the methylol group-containing compound according to (b) and acyl chloride in the presence of a basic catalyst.

Specific examples of the compound according to (b), which has the substituent above, are shown below.

Examples of the melamine compound include hexamethylolmelamine, hexamethoxymethylmelamine, the compounds obtained by methoxymethylating 1 to 5 methylol groups of the hexamethylolmelamine or a mixture thereof, hexamethoxyethylmelamine, hexaacyloxymethylmelamine, compounds obtained by acyloxymethylating 1 to 5 methylol groups of the hexamethylolmelamine or a mixture thereof, and the like.

Examples of the guanamine compound include tetramethylolguanamine, tetramethoxymethylguanamine, compounds obtained by methoxymethylating 1 to 3 methylol groups of tetramethylolguanamine and a mixture thereof, tetramethoxyethylguanamine, tetraacyloxymethylguanamine, compounds obtained by acyloxy-methylating 1 to 3 methylol groups of tetramethylolguanamine and a mixture thereof, and the like.

Examples of the glycoluryl compound include tetramethylolglycoluryl, tetramethoxymethylglycoluryl, compounds obtained by methoxy-methylating 1 to 3 methylol groups of tetramethylolglycoluryl and a mixture thereof, compounds obtained by acyloxy-methylating 1 to 3 methylol groups of tetramethylolglycoluryl and a mixture thereof, and the like.

Examples of the urea compound include tetramethylolurea, tetramethoxymethylurea, compounds obtained by methoxy-methylating 1 to 3 methylol groups of tetramethylolurea and a mixture thereof, tetramethoxyethylurea, and the like.

The compounds according to (b) may be used singly or in combination.

The above crosslinking agent (c), i.e., the phenol compound, naphthol compound or hydroxyanthracene compound substituted by at least one group selected from a methylol group, an alkoxymethyl group, and an acyloxymethyl group prevents intermixing with an overcoated photoresist, and also further increases the film strength by thermal crosslinking.

Hereinafter, these compounds are collectively referred to as the compound (methylol group-containing compound, alkoxymethyl group-containing compound, or acyloxymethyl group-containing compound) according to (c) in some cases.

It is necessary that the crosslinking agent(c) contain at least two substituents selected from a methylol group, an acyloxymethyl group, and an alkoxymethyl group in one molecule. From the viewpoints of thermal crosslinking property and storage stability, the phenol compound that constitutes a skeleton preferably has the substituents at both of the 2-positions and the 4-position. Moreover, the naphthol and hydroxyanthracene compounds that constitute a skeleton preferably have the substituents at both of the ortho-positions and the para-position with respect to the OH group. The phenol compound that constitutes the skeleton may or may not have a substituent at a 3- or 5-position. Further, the naphthol compound that constitutes the skeleton may or may not have a substituent at positions other than the ortho position with respect to the OH group.

The methylol group-containing compound according to (c) may be obtained by reacting a compound having a hydrogen atom at an ortho- or para-position (2- or 4-position) with respect to a phenolic OH group and serving as a raw material and formalin in the presence of a basic catalyst such as sodium hydroxide, potassium hydroxide, ammonia, tetraalkyl ammonium hydroxide, and the like.

The alkoxymethyl group-containing compound according to (c) can be obtained by heating the methylol group-containing compound according to (c) in alcohol in the presence of an acidic catalyst such as hydrochloric acid, sulfuric acid, nitric acid, methanesulfonic acid, and the like.

The acyloxymethyl group-containing compound according to (c) can be obtained by reacting the methylol group-containing compound according to (c) and acyl chloride in the presence of a basic catalyst.

Examples of the skeleton compound in the crosslinking agent (c) include a phenol compound, a naphthol compound, a hydroxyanthracene compound, and the like, each of which has no substituent at the ortho- or para-position with respect to the phenolic OH group. Specific examples thereof include phenol, isomers of cresol, 2,3-xylenol, 2,5-xylenol, 3,4-xylenol, 3,5-xylenol, bisphenols such as bisphenol A and the like, 4,4'-bishydroxybiphenyl, Tris P-PA (manufactured by Honshu Chemical Industry Co., Ltd.), naphthol, dihydroxynaphthalene, 2,7-dihydroxyanthracene, and the like.

Specific examples of the compound according to (c) include trimethylolphenol, tri(methoxymethyl)phenol, compounds obtained by methoxy-methylating 1 to 2 methylol groups of trimethylolphenol, trimethylol-3-cresol, tri(methoxymethyl)-3-cresol, compounds obtained by methoxy-methylating 1 to 2 methylol groups of trimethylol-3-cresol, dimethylol cresol such as 2,6-dimethylol-4-cresol and the like, tetramethylolbisphenol-A, tetramethoxymethylbisphenol-A, compounds obtained by methoxy-methylating 1 to 3 methylol groups of tetramethylolbisphenol-A, tetramethylol-4,4'-bishydroxybiphenyl, tetramethoxymethyl-4,4'-bishydroxybiphenyl, a hexamethylol compound of Tris P-PA, a hexamethoxymethyl compound of Tris P-PA, compounds obtained by methoxy-methylating 1 to 5 methylol groups of the hexamethylol compound of Tris P-PA, bishydroxymethylnaphthalenediol, and the like.

Furthermore, examples of the hydroxyanthracene compound include 1,6-dihydroxymethyl-2,7-dihydroxyanthracene and the like.

In addition, examples of the acyloxymethyl group-containing compound include compounds obtained by acyloxymethylating a part or all of the methylol groups of the methylol group-containing compound.

Among those compounds, preferable examples thereof include trimethylolphenol, bishydroxymethyl-p-cresol, tetramethylolbisphenol A, a hexamethylol compound of Tris P-PA (manufactured by Honshu Chemical Industry Co., Ltd.), or a phenol compound obtained by substituting the methylol groups of these compounds to alkoxymethyl groups or both of methylol groups and alkoxymethyl groups.

These compounds according to (c) may be used singly or in combination.

When the curable composition of the invention contains a crosslinking agent, the content of the crosslinking agents (a) to (c) in the curable composition varies according to the raw materials, but it is preferably from 1 to 70% by mass, more preferably from 5 to 50% by mass, and particularly preferably from 7 to 30% by mass, based on the entire solid contents (mass) of the composition. If the content is within the above range, sufficient curing degrees and eluting property of the unexposed portion can be maintained, and there is no case where the curing degree of the exposed portion is insufficient or the eluting property of the unexposed portion is remarkably lowered.

<Polymerizable Monomers>

Preferably, the curable composition of the invention can contain at least one polymerizable monomer. The polymerizable monomer is contained primarily for forming a curable composition in a negative working.

Further, the positive working system containing a naphthoquinonediazide compound to be described later may contain the polymerizable monomer in combination with a photopolymerization initiator to be described later. In this case, the curing degree of the pattern formed can be further heightened. Hereinbelow, the polymerizable monomers will be described.

The polymerizable monomer is preferably a compound having at least one addition-polymerizable ethylenically unsaturated groups and having a boiling point of 100° C. or higher under normal pressure. Examples thereof include monofunctional acrylates and methacrylates, such as polyethylene glycol mono(meth)acrylate, polypropylene glycol mono(meth)acrylate, phenoxyethyl (meth)acrylate, and the like, and polyfunctional acrylates or methacrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, a product obtained by adding ethylene oxide or propylene oxide to a polyfunctional alcohol such as glycerin, trimethylolethane, and the like, followed by (meth)acrylation, urethane acrylates as described JP-B Nos. 48-41708 and 50-6034, and JP-A No. 51-37193, polyester acrylates described in JP-A No. 48-64183, and JP-B Nos. 49-43191 and 52-30490, epoxy acrylates which are products of reaction between an epoxy resin and a (meth)acrylic acid, and the like, and mixtures thereof.

Other examples include those disclosed as photocurable monomers and oligomers in Journal of the Adhesion Society of Japan, Vol. 20, No. 7, pp. 300 to 308.

The total content of the polymerizable monomers in the curable composition is preferably from 0.1% by mass to 90% by mass, more preferably from 1.0% by mass to 80% by mass, and particularly preferably from 2.0% by mass to 70% by mass, based on the solid content in the curable composition.

<Radiation-Sensitive Compound>

Preferably, the curable composition of the invention can contain at least one radiation-sensitive compound. The radiation-sensitive compound according to the invention is a compound that can cause a chemical reaction such as generation of a radical, generation of an acid, generation of a base, and the like, but the radiation-sensitive compound is used so as to insolubilize the binder by reaction such as crosslinking, polymerization, decomposition of an acidic group, and the like, and so as to insolubilize the coating film against an alkaline developer by causing of polymerization of polymerizable monomers or oligomers that co-exist in the coating film, crosslinking of a crosslinking agent, or the like.

The curable composition preferably contains a photopolymerization initiator particularly when it is of a negative working, while it preferably contains a naphthoquinonediazide compound when it is of a positive working.

<Photopolymerization Initiator>

Next, a photopolymerization initiator that is contained when the curable composition of the invention is a negative working composition will be described.

The photopolymerization initiator is not particularly limited as long as it can polymerize the above-described polymerizable monomer, and is preferably selected from the viewpoints of characteristics, initiation efficiency, absorption wavelength, availability, cost, and the like.

In addition, the photopolymerization initiator may be contained in a positive working system containing the above-described naphthoquinonediazide compound, and in this case, the curing degree of the pattern formed can be further heightened.

Examples of the photopolymerization initiator include at least one active halogen compound selected from a halomethyloxadiazole compound and a halomethyl-s-triazine compound, a 3-aryl-substituted coumalin compound, a lophine dimer, a benzophenone compound, an acetophenone compound or a derivative thereof, a cyclopentadiene-benzene-iron complex or a salt thereof, an oxime compound, and the like.

Examples of active halogen compounds such as halomethyl oxadiazole and the like include a 2-halomethyl-5-vinyl-1,3,4-oxadiazole compound and the like described in JP-B No. 57-6096, 2-trichloromethyl-5-styryl-1,3,4-oxadiazole, 2-trichloromethyl-5-(p-cyanostyryl)-1,3,4-oxadiazole, 2-trichloromethyl-5-(p-methoxystyryl)-1,3,4-oxadiazole, and the like.

Examples of the halomethyl-s-triazine-based compound include a vinyl-halomethyl-s-triazine compound described in JP-B No. 59-1281, and a 2-(naphtho-1-yl)-4,6-bis-halomethyl-s-triazine compound and a 4-(p-aminophenyl)-2,6-di-halomethyl-s-triazine compound described in JP-A No. 53-133428.

Other examples thereof include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis-trichloromethyl-s-triazine, 2-(4-methoxynaphtho-1-yl)-4,6-bis-trichloromethyl-s-triazine, 2-(4-ethoxynaphtho-1-yl)-4,6-bis-trichloromethyl-s-triazine, 2-(4-butoxynaphtho-1-yl)-4,6-bis-trichloromethyl-s-triazine, 2-[4-(2-methoxy ethyl)-naphtho-1-yl]-4,6-bis-trichloromethyl-s-triazine, 2-[4-(2-ethoxy ethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxynaphtho-1-yl)-4,6-bis-trichloromethyl-s-triazine, 2-(6-methoxy-5-methylnaphtho-2-yl)-4,6-bis-trichloromethyl-s-triazine, 2-(6-methoxynaphtho-2-yl)-4,6-bis-trichloromethyl-s-triazine, 2-(5-methoxynaphtho-1-yl)-4,6-bis-trichloromethyl-s-triazine, 2-(4,7-dimethoxynaphtho-1-yl)-4,6-bis-trichloromethyl-s-triazine, 2-(6-ethoxynaphtho-2-yl)-4,6-bis-trichloromethyl-s-triazine, 2-(4,5-dimethoxynaphtho-1-yl)-4,6-bis-trichloromethyl-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl-2,6-di(trichloromethyl)-s-triazine, 4-[o-chloro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, 4-(o-fluoro-p-N-chloroethylaminophenyl)-2,6-di(trichloromethyl)-s-triazine, and the like.

Besides, TAZ series manufactured by Midori Kagaku Co., Ltd., such as TAZ-107, TAZ-110, TAZ-104, TAZ-109, TAZ-140, TAZ-204, TAZ-113, and TAZ-123, T series manufactured by PANCHIM Ltd., such as T-OMS, T-BMP, T-R, and T-B, IRGACURE series manufactured by Ciba Specialty Chemicals, such as IRGACURE 369, IRGACURE 784, IRGACURE 651, IRGACURE 184, IRGACURE 500, IRGACURE 1000, IRGACURE 149, IRGACURE 819, and IRGACURE 261, DAROCURE series, such as DAROCURE 1173, 4,4'-bis(diethylamino)-benzophenone, 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone, 2-benzyl-2-dimethylamino-4-morpholinobutylophenone, 2,2-dimethoxy-2-phenylacetophenone, a 2-(o-chlorophenyl)-4,5-diphenylimidazolyl dimer, a 2-(o-fluorophenyl)-4,5-diphenylimidazolyl dimer, a 2-(o-methoxyphenyl)-4,5-diphenylimidazolyl dimer, a 2-(p-methoxyphenyl)-4,5-diphenylimidazolyl dimer, a 2-(p-dimethoxyphenyl)-4,5-diphenylimidazolyl dimer, a 2-(2,4-dimethoxyphenyl)-4,5-diphenylimidazolyl dimer, a 2-(p-methylmercaptophenyl)-4,5-diphenylimidazolyl dimer, a benzoin isopropyl ether, and the like are also usefully employed.

Particularly preferable examples thereof include oxime-O-acyl-based compounds such as 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone, and the like.

For the curable composition of the invention, other known photopolymerization initiators may be used in combination with the afore-mentioned photopolymerization initiators.

Specific examples thereof include vicinal polyketol aldonyl compounds disclosed in the specification of U.S. Pat. No. 2,367,660, α-carbonyl compounds disclosed in the specification of U.S. Pat. Nos. 2,367,661 and 2,367,670, acyloin ether disclosed in the specification of U.S. Pat. No. 2,448,828, α-hydrocarbon-substituted aromatic acyloin compounds disclosed in the specification of U.S. Pat. No. 2,722,512, polynuclear quinone compounds disclosed in the specification of U.S. Pat. Nos. 3,046,127 and 2,951,758, a triarylimidazole dimer/p-aminophenyl ketone combination disclosed in the specification of U.S. Pat. No. 3,549,367, a benzothiazole compound/a trihalomethyl-s-triazine compound disclosed in JP-B No. 51-48516, and the like.

The content of the photopolymerization initiator in the curable composition is preferably from 0.01 to 50% by mass, more preferably from 1 to 30% by mass, and particularly preferably from 1 to 20% by mass, based on the solid content of the polymerizable monomers. When the content is within the above range, the polymerization easily proceeds, which can yield better film strength.

Further, a sensitizer and a light stabilizer may be used in combination with these photopolymerization initiators.

Specific examples thereof include benzoin, benzoin methyl ether, 9-fluorenon, 2-chloro-9-fluorenon, 2-methyl-9-fluorenon, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzalacetone, p-(dimethylamino)phenylstyrylketone, p-(dimethylamino)phenyl-p-methylstyrylketone, benzophenone, p-(dimethylamino) benzophenone (or Michler's ketone), p-(diethylamino) benzophenone, benzoanthrone, and the like, benzothiazole-based compounds and the like described in JP-B No. 51-48516, TINUVIN 1130 and TINUVIN 400, and the like.

In addition, it is preferable to add a thermal polymerization inhibitor. For example, hydroquinone, p-methoxy phenol, di-t-butyl-p-cresol, pyrogallol, t-butyl cathecol, benzoquinone, 4,4'-thiobis(3-methyl-6-t-butylphenol), 2,2'-methylenebis(4-methyl-6-t-butylphenol), 2-mercaptobenzoimidazole, and the like are useful.

—Naphthoquinonediazide Compound—

Next, the naphthoquinonediazide compound that is contained when the curable composition of the invention is of a positive working will be described.

The naphthoquinonediazide compound is a compound having at least one o-quinonediazido group, and examples thereof include an o-naphthoquinonediazide-5-sulfonic ester, an o-naphthoquinonediazide-5-sulfonic acid amide, an o-naphthoquinonediazide-4-sulfonic ester, an o-naphthoquinonediazide-4-sulfonic acid amide, and the like. These esters and amide compounds can be prepared by known methods using, for example, a phenol compound represented by the formula (I) in JP-A Nos. 2-84650 and 3-49437, and the like.

When the curable composition of the invention is of a positive type, the amount of each of the binder and the crosslinking agent is usually dissolved at a ratio from about 2 to about 50% by mass, and preferably from about 2 to about 30% by mass in the organic solvent. Each of the naphthoquinonediazide compound and the entire coloring materials including the metal phthalocyanine mixture is usually added at a content ratio from about 2 to about 30% by mass, and preferably about 2 to about 50% by mass, based on the solution in which the binder and the crosslinking agent are dissolved.

<Solvent>

An solvent may be generally contained upon preparation of the curable composition of the invention. The solvent to be used is essentially not particularly limited as long as the solubility of respective components of the composition and the coating properties of the curable composition are satisfied, but it is preferably selected in consideration of the solubility, coating property, and safety of the binder, in particular.

Specific examples of the preferable solvent include esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, and the like, alkyl 3-oxypropionate esters such as methyl 3-oxypropionate, ethyl 3-oxypropionate, and the like (for example, methyl 3-methoxypropionate, ethyl 3-methoxypropionate, methyl 3-ethoxypropionate, ethyl 3-ethoxypropionate, and the like), alkyl 2-oxypropionate esters such as methyl 2-oxypropionate, ethyl 2-oxypropionate, propyl 2-oxypropionate, and the like (for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, and the like), methyl pyruvate, ethyl pyruvate, propyl pyruvate, methyl acetoacetate, ethyl acetoacetate, methyl 2-oxobutanoate, ethyl 2-oxobutanoate, and the like, ethers, for example, diethylene glycol dimethyl ether, tetrahydrofuran, ethylene glycol monomethyl ether, ethylene glycol monoethyl ether, methylcellosolve acetate, ethylcellosolve acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, propylene glycol propyl ether acetate, ethyl carbitol acetate, butyl carbitol acetate, and the like, ketones, for example, methyl ethyl ketone, cyclohexanone, 2-heptanone, 3-heptanone, and the like, and aromatic hydrocarbons, for example, toluene, xylene, and the like.

Among the above solvents, methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, propylene glycol methyl ether acetate, and the like are more preferable.

<Various Additives>

The curable composition according to the invention may contain, if necessary, various additives, for example, a filler, a macromolecular compound other than those described above, a surfactant, an adhesion promoting agent, an antioxidant, an ultraviolet absorbent, an aggregation inhibitor, and the like.

Specific examples of the above-mentioned various additives include fillers such as glass, alumina, and the like, macromolecular compounds other than a binding resin, such as polyvinyl alcohol, polyacrylic acid, polyethylene glycol monoalkyl ethers, polyfluoroalkyl acrylates, and the like, surfactants such as nonionic, cationic, and anionic surfactants, and the like, adhesion promoting agents such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, and the like, antioxidants such as 2,2-thiobis(4-methyl-6-t-butylphenol), 2,6-di-t-butylphenol, and the like, ultraviolet absorbents such as 2-(3-t-butyl-5-methyl-2-hydroxyphenyl)-5-chlorobenzotriazole, alkoxybenzophenone, and the like, and aggregation inhibitors such as sodium polyacrylate and the like.

Furthermore, an organic carboxylic acid, and preferably a low molecular weight organic carboxylic acid having a molecular weight of 1000 or less may be added to the composition for the purpose of further improving the developability of the curable composition of the invention by increasing the alkali solubility of portions to be removed by development (for example, in the case of a negative working, a non-cured portion). Specific examples thereof include aliphatic monocarboxylic acids such as formic acid, acetic acid, propionic acid, butyric acid, valeric acid, pivalic acid, caproic acid, diethylacetic acid, enanthic acid, caprylic acid, and the like, aliphatic dicarboxylic acids such as oxalic acid, malonic acid, succinic acid, glutaric acid, adipic acid, pimelic acid, suberic acid, azelaic acid, sebasic acid, brassylic acid, methylmalonic acid, ethylmalonic acid, dimethylmalonic acid, methylsuccinic acid, tetramethylsuccinic acid, citraconic acid, and the like, aliphatic tricarboxylic acids such as tricarballylic acid, aconitic acid, camphoronic acid, and the like, aromatic monocarboxylic acids such as benzoic acid, toluic acid, cumic acid, hemellitic acid, mesitylenic acid, and the like, aromatic polycarboxylic acids such as phthalic acid, isophthalic acid, terephthalic acid, trimellitic acid, trimesic acid, mellophanic acid, pyromellitic acid, and other carboxylic acids such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid, umbellic acid, and the like.

The curable composition of the invention can be suitably used in the formation of color pixels of a color filter or the like used in a liquid crystal display (LCD), solid-state image sensing devices (for example, CCD, CMOS, and the like), etc., or in the preparation of an printing ink, an inkjet ink, a paint, or the like. Particularly, it can be suitably used in the formation of color pixels of solid-state imaging devices such as CCD, CMOS, and the like.

—Color Filter and Method of Producing of the Same—

The color filter of the invention and a method for producing the same will be described in detail.

For the method of producing the color filter of the invention, the curable composition according to the invention described above is used. The color filter of the invention can be formed by applying the curable composition of the invention on a support by a coating method such as rotation coating, cast coating, roll coating, and the like to form a radiation-sensitive composition layer, exposing the layer through a predetermined mask pattern, and developing the layer with a developer to form a negative working or positive working colored pattern (resist pattern).

The exposure light source which can be applied to the curable composition for a color filter in the invention is a light source having a wavelength of 400 nm or less. The exposure light source is not particularly limited, but as a lamp light source, for example, a xenon lamp, a halogen lamp, a tungsten lamp, a high pressure mercury lamp, an ultra pressure mercury lamp, a metal halide light, a medium pressure mercury lamp, a low pressure mercury lamp, carbon arc, a fluorescent lamp, and the like, an Ar ion laser (364 nm, 351 nm, 10 mW to 1 W), a Kr ion laser (356 nm, 351 nm, 10 mW to 1 W), a solid laser, for example, a combination of Nd:YAG (YVO4) with SHO crystals×2 (355 nm, 5 mW to 1 W), a combination of a waveguide-type wavelength conversion element with an AlGaAs, a combination of a waveguide-type wavelength conversion element with an AlGaInP or AlGaAs semiconductor (300 nm to 350 nm, 5 mW to 100 mW), and further, a pulse laser, for example, an $N_2$ laser (337 mm, pulse 0.1 to 10 mJ), XeF (351 nm, pulse 10 to 250 mJ), or the like may be used. In the case where only a specific wavelength is used, an optical filter may be used.

In addition, examples of the exposure light source include UV rays such as an ArF excimer laser (wavelength 193 nm), an KrF excimer laser (wavelength 248 nm), an i ray (wavelength 365 nm), and the like. From the viewpoints of cost and exposure energy, a particularly preferable exposure light source is an UV ray, including an i ray.

Moreover, a curing step of further curing by heating and/or exposing the pattern formed may be provided, if necessary. As the light or radiation used at this time, particularly radiations such as an i ray and the like are preferably used.

In the preparation of the color filter of the invention, the color filter that is constituted with a desired number of colors can be manufactured, in the case of a negative working, by repeating an image formation step (and if necessary, a curing step) according to a desired number of colors, or in the case of a positive working, by repeating an image formation step and a post-baking step according to a desired number of colors.

Examples of the support include soda glass, PYREX (registered trademark) glass, and quartz glass, which are each used in liquid crystal display devices or the like, and materials produced by adhering a transparent conductive film onto any of the above supports, photoelectric conversion element substrates used in image sensing devices or the like, for example, a silicon substrate, etc., a complementary metal oxide film semiconductor (CMOS), and the like. These supports may have black stripes formed thereon that separate each pixel.

Furthermore, on these supports, if necessary, an undercoat layer may be provided so as to improve adhesion between the support and the upper layer, so as to prevent the diffusion of the substances, or so as to flatten the support surface.

As a developer used in a method for producing the color filter of the invention, any developer may be used as long as it has a composition that dissolves a portion to be removed with development (uncured portions in the case of a negative working) but does not dissolve the other portions (cured portions in the case of a negative working) Specifically, a combination of various organic solvents, or an aqueous alkaline solution can be used. Examples of the organic solvents include those as mentioned in the above-described solvents that are used in the preparation of the composition of the invention.

As the aqueous alkaline solution, for example, an aqueous alkaline solution wherein an alkaline compound, for example, sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, 1,8-diazabicyclo-[5.4.0]-7-undecene, and the like is dissolved in water to give a concentration of 0.001 to 10% by mass, and preferably 0.01 to 1% by mass. Further, when such an aqueous alkaline solution is used as a developer, it is generally preferable to wash the color filter with water after development.

The color filter of the invention can be used in solid-state image sensing devices such as a liquid crystal display device, CCD, and the like, and can also be used as a color filter, for example, disposed between a light receiving section of each pixel of CCD and a microlens for collecting light. Particularly, by using the composition of the invention for a high resolution CCD device, a high resolution CMOS device, and the like, each having more than one million pixels, the film thickness of the color filter can be smaller, which can be thus more suitably used.

EXAMPLES

Hereinbelow, the present invention will be specifically described with reference to the Examples, but the invention is not limited thereto.

The curable composition containing the metal phthalocyanine dye mixture of the invention, a color filter using the composition, and a method for producing the same will be described below.

Example 1

1) Preparation of Resist Solution

A resist solution was prepared by mixing and dissolving the following components:

| | |
|---|---|
| Propylene glycol monomethyl ether acetate (PGMEA) | 19.20 parts |
| Ethyl lactate | 36.67 parts |
| Binder: (40% PGMEA solution of benzyl methacrylate/methacrylic acid/2-hydroxyethyl methacrylate copolymer (molar ratio = 60:22:18)) | 30.51 parts |
| Dipentaerythritol hexaacrylate | 12.20 parts |
| Polymerization inhibitor (p-methoxyphenol) | 0.0061 part |
| Fluorinated surfactant (F-475, manufactured by Dainippon Ink and Chemicals Inc., Company name changed to DIC Corporation in 2008) | 0.83 part |
| Photopolymerization initiator TAZ-107 (manufactured by Midori Kagaku Co., Ltd.) | 0.586 parts |

2) Preparation of Glass Substrate Provided with Undercoat Layer

After a glass substrate (CORNING 1737) was washed with a 0.5% NaOH solution by means of an ultrasonic wave, rinsed with water, and subjected to dehydration baking (200° C./20 min).

Subsequently, the resist solution of the above 1) was applied onto the washed glass substrate by using a spin coater to a film thickness of 0.6 μm, heated and dried at 220° C. for 1 hour to obtain a cured film (undercoat layer).

3) Preparation of Colored Resist Solution (Colored Curable Composition) A-1
[Negative Working]

A dye-containing resist solution was prepared by mixing and dissolving the following compositions.

| (Composition) | |
|---|---|
| Cyclohexanone | 80 parts |
| Colorant (exemplary dye mixture Ca-1) | 8.16 parts |
| KARAYAD DPHA (manufactured by Nippon Kayaku Co., Ltd.) | 4.91 parts |
| Photopolymerization initiator (CGI-242: manufactured by Ciba Specialty Chemicals) | 1.50 parts |
| Cyclohexylmethylamine | 0.60 part |
| Surfactant F-781 (manufactured by Dainippon Ink and Chemicals Inc.) | 0.03 part |

4) Formation of Resist Film, Exposure, and Development

The colored resist solution A-1 obtained in the above 3) was applied onto the glass substrate provided with the undercoat layer obtained in the above 2) by using a spin coater to a film thickness of 0.6 μm to form a photocuring coating film. The film was prebaked at 100° C. for 120 seconds to obtain a color filter.

—Evaluation—

The colored curable composition A-1 prepared above was evaluated with respect to storage stability, and the heat resistance and light-fastness of the coating film formed by the application on the glass substrate in the following manner. The results are shown in Tables 1 and 2.

<Storage Stability>

After the colored curable composition A-1 was stored at room temperature (20 to 25° C.) for one month, and the degree of deposition of the foreign materials after storage was visually evaluated in accordance with the following evaluation criteria.

~Evaluation Criteria~
A: Deposition of materials was not observed.
B: Slight deposition of materials was observed.
C: Deposition was observed.

<Heat Resistance>

The glass substrate onto which the colored curable composition A-1 had been applied was heated by a hot plate at 200° C. for 1 hour, and then the chromaticity difference (ΔEab value) between the chromaticity prior to the heat resistance test and the chromaticity after the heat resistance test was measured by means of a chromoscope MCPD-1000 (manufactured by Otsuka Electronics Co., Ltd.), and evaluated according to the following evaluation criteria. A smaller ΔEab value indicates better heat resistance.

~Evaluation Criteria~
A: ΔEab value<3 or less
B: 3≦ΔEab value≦10
C: 10<ΔEab value <Light-Fastness>

The glass substrate onto which the colored curable composition A-1 had been applied was irradiated with light at 100000 lux (corresponding to 1000000 lux·h) for 20 hours by means of a xenon lamp, and then the chromaticity difference, ΔEab value, between the chromaticity prior to the light-fastness test and the chromaticity after the light-fastness test was measured. A smaller ΔEab value indicates better heat resistance.

~Evaluation Criteria~
A: ΔEab value<3
B: 3≦ΔEab value≦10
C: 10<ΔEab value

Examples 2 to 35

In Examples 2 to 35 shown in Tables 1 and 2, the exemplary compound Ca-1 of Example 1 was used to manufacture a colored curable composition in the same method as in Example 1 except that equivalent moles were substituted to the compounds of Tables 1 and 2, and the manufactured colored curable composition was applied onto the glass substrate provided with the undercoat layer to obtain a color filter.

In the same manner as in Example 1, the colored curable composition was evaluated with respect to storage stability, heat resistance, and light-fastness. The results are shown in Tables 1 and 2.

Comparative Examples 1 to 3

The same procedure as Example 1 was carried out except that equivalent moles of the colorant of the colored curable composition A-1 prepared in the above 3) of Example 1 were substituted to the dyes of Comparative Examples 1 to 3 in Tables 1 and 2. The results are shown in Tables 1 and 2.

TABLE 1

|  | Exemplary dye mixture No. | Stability over time | Heat resistance | Light-fastness |
| --- | --- | --- | --- | --- |
| Example 1 | Ca-1 | A | A | A |
| Example 2 | Ca-2 | A | A | A |
| Example 3 | Ca-3 | A | A | A |
| Example 4 | Ca-4 | A | A | A |
| Example 5 | Ca-5 | A | A | A |
| Example 6 | Ca-6 | A | A | A |
| Example 7 | Ca-7 | A | A | A |
| Example 8 | Ca-8 | A | A | A |
| Example 9 | Ca-9 | A | A | A |
| Example 10 | Ca-11 | A | A | A |
| Example 11 | Ca-12 | A | A | A |
| Example 12 | Ca-15 | A | A | A |
| Example 13 | Ca-18 | A | A | A |
| Example 14 | Ca-21 | A | A | A |
| Example 15 | Ca-22 | A | A | A |
| Example 16 | Ca-23 | A | A | A |
| Example 17 | Ca-26 | A | A | A |
| Example 18 | Ca-27 | A | A | A |
| Example 19 | Ca-28 | A | A | A |
| Example 20 | Ca-30 | A | A | A |
| Example 21 | Ca-31 | A | A | A |
| Example 22 | Ca-32 | A | A | A |
| Example 23 | Cb-1 | A | A | A |
| Example 24 | Cb-2 | A | A | A |
| Example 25 | Cb-3 | A | A | A |
| Example 26 | Cb-6 | A | A | A |
| Example 27 | Cb-7 | A | A | A |
| Example 28 | Cb-14 | A | A | A |
| Example 29 | Cb-15 | A | A | A |
| Example 30 | Cb-17 | A | A | A |
| Example 31 | Cb-18 | A | A | A |

TABLE 1-continued

|  | Exemplary dye mixture No. | Stability over time | Heat resistance | Light-fastness |
| --- | --- | --- | --- | --- |
| Example 32 | Cb-19 | A | A | A |
| Example 33 | Cb-20 | A | A | A |
| Example 34 | Cc-1 | A | A | A |
| Example 35 | Cc-8 | A | A | A |

TABLE 2

|  | Dye | Stability over time | Heat resistance | Light-fastness |
| --- | --- | --- | --- | --- |
| Comparative Example 1 | C.I. Solvent Blue 67 | C | C | C |
| Comparative Example 2 | C.I. Acid Green 16 | C | C | C |
| Comparative Example 3 | C.I. Solvent 25 | C | C | C |

Examples 36 to 70

—Exposure•Development (Image Formation)—

By using an exposure device, the coated material on the glass substrate used in Examples 1 to 35 above was irradiated at an exposure amount of 500 mj/cm$^2$ with a wavelength of 365 nm via a mask having a line width of 20 μm. After exposure, the coated material was developed under the conditions of 25° C. for 60 seconds by using a developer (trade name: CD-2000, manufactured by Fujifilm Electronic Materials Co., Ltd.). Thereinafter, the coated material was rinsed for 20 seconds with running water and then spray-dried to form a colored pattern suitable for a color filter.

—Evaluation—

<Pattern Formability>

Further, the "color remaining rate in exposed portions" was measured by means of a chromoscope (trade name: MCPD-1000, manufactured by Otsuka Electronics Co., Ltd.). The change rate in absorptivity between the absorptivity prior to the development and the absorptivity after the development was determined.

In Examples 36 to 70 of the invention, all of the color remaining rates of the pattern portions after development showed color remaining rates of 98% or more.

It could be seen that the curable composition containing the dye mixture of the invention has excellent storage stability, the color filter using the colored curable composition has excellent heat resistance and light-fastness, and the change in the concentrations in the pattern portions after the development treatment is small.

Examples 71 to 105

1) Preparation of Silicon Wafer Substrate with Undercoat Layer

A 6 inch silicon wafer was subjected to heat treatment in an oven at 200° C. for 30 minutes. Then, the resist solution used in the silicon wafer substrate provided with an undercoat layer was applied onto the silicon wafer so as to have a dry film thickness of 0.6 μm, and further, it was heated and dried in an 220° C. oven for 1 hour to form an undercoat layer, thereby obtaining a silicon wafer substrate adhered with the undercoat layer.

The colored curable composition used in Examples 1 to 35 was applied onto the undercoat layer of the silicon wafer substrate provided with an undercoat layer obtained in the above 1) to give a dry film thickness of 0.6 μm, thereby forming a colored curable coating film. Then, the film was subjected to a heat treatment (prebaking) by using a hot plate at 100° C. for 120 seconds. Then, the film was irradiated at a wavelength of 365 nm via an island pattern mask of 1.2 μm length and 1.2 μm width in the pattern by using an i ray stepper exposure device FPA-3000i5+ (manufactured by Canon Inc.) with the exposure amount varied in the range from 100 to 2500 mJ/cm$^2$ at a change rate of 100 mJ/cm$^2$. Thereafter, the silicon wafer substrate with the irradiated coating film formed thereon was placed again on a horizontal rotatable table of a spin-shower developing device (DW-30 type; manufactured by Chemitronics Corp.), and subjected to paddle development at 23° C. for 60 seconds using a 50% by mass aqueous solution of CD-2000 (manufactured by Fuji Film Electronics Materials, Corp.), to form a colored pattern on the silicon wafer substrate.

The formed blue (compositions of Examples 1 to 22, 34, and 35) to green (compositions of Examples 23 to 33) colored pattern image showed a good profile having a square shape in the rectangular cross-section, which is suitable for an imaging device.

Example 106

1) Preparation of Colored Curable Composition [Positive Working]

A colored curable composition [positive working] was obtained by mixing and dissolving the following components:

| | |
|---|---|
| Ethyl lactate (EL) | 30 parts |
| Resin P-1 shown below | 3.0 parts |
| Naphthoquinonediazide compound N-1 shown below | 1.8 parts |
| Crosslinking agent: hexamethoxymethylolated melamine | 0.6 part |
| Photoacid generator: TAZ-107 (manufactured by Midori Kagaku Co., Ltd.) | 1.2 parts |
| Fluorine-based surfactant (F-475, manufactured by Dainippon Ink And Chemicals, Inc.) | 0.0005 part |
| Exemplary dye mixture Ca-1 | 0.4 part |

The resin P-1 and the naphthoquinonediazide compound (N-1) were synthesized in the following manner.

2) Synthesis of Resin P-1

70.0 g of benzylmethacrylate, 13.0 g of methacrylic acid, 17.0 g of 2-hydroxyethyl methacrylate, and 600 g of 2-methoxypropanol were added in a three-necked flask, and an agitating device, a reflux cooling tube and a thermometer were attached thereto. A catalytic amount of a polymerization initiator V-65 (manufactured by Wako Pure Chemical Industries Ltd.) was added to the contents of the flask under a nitrogen flow at 65° C., followed by stirring for 10 hours. The resultant resin solution was added dropwise to 20 L of ion exchanged water while vigorously stirring to obtain a white powder. This white powder was vacuum dried at 40° C. for 24 hours to obtain 145 g of Resin P-1. The molecular weight was measured by means of GPC, and was found to be as follows: the weight average molecular weight Mw=28,000 and the number average molecular weight Mn=11,000.

3) Synthesis of Naphthoquinonediazide Compound (N-1)

42.45 g of Trisp-PA (manufactured by Honshu Chemical Industry Co., Ltd.), 61.80 g of o-naphthoquinonediazide 5-sulfonyl chloride, and 300 ml of acetone were placed in a three-necked flask. 24.44 g of trimethylamine was added dropwise to the contents of the flask at room temperature (25° C.) over one hour. After completion of the dropwise addition, the reaction liquid was poured into a large amount of water under stirring. The precipitated naphthoquinonediazide sulfonate ester was collected by suction filtration and vacuum dried at 40° C. for 24 hours to obtain a photosensitive naphthoquinonediazide Compound N-1.

4) Exposure and Development (Image Formation) of Colored Curable Composition

The colored curable composition [positive working] prepared as described above was applied onto the glass substrate provided with an undercoat layer in the same manner as in Example 36, and then subjected to prebaking, irradiation, development, rinsing, and drying to obtain a blue image pattern. Thereafter, this pattern image was heated at 180° C. for 5 minutes (postbaking) to obtain a color filter. The formed blue pattern image showed a good profile having a rectangular shape.

By the same method as in Example 1, the colored curable composition using the compound of the invention was evaluated with respect to the storage stability, and the heat resistance and the light-fastness of the color filter. It could be seen that the storage stability was excellent, and the heat resistance and the light-fastness were all good.

The disclosure of Japanese Patent Application No. 2008-078919 is incorporated herein by reference in its entirety.

The invention claimed is:

1. A curable composition comprising:
a mixture of metal phthalocyanine dyes, wherein the mixture is formed using at least phthalonitrile, a compound represented by the following formula (I), a compound represented by the following formula (II), and a metal or a metal compound; and
a radiation-sensitive compound:

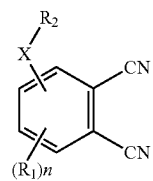

FORMULA (I)

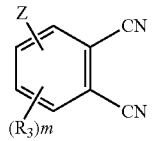

FORMULA (II)

wherein, in formulae (I) and (II), R$_1$ represents a substituent; n represents an integer of from 0 to 3; X represents —S—, —SO$_2$—, or —SO$_2$N(R$_4$)—; R$_4$ represents a hydrogen atom, an alkyl group, an alkenyl group, an aryl group, or a heterocyclic ring group; R$_2$ represents an alkyl group, an alkenyl group, an aryl group, or a heterocyclic ring group; R$_3$ represents a substituent; m represents an integer of from 0 to 3; and Z represents —SO$_3$M or —(X$_1$-A) group; wherein X$_1$ has the same definition as X; A represents an optionally substituted group having at least one selected from —COOM, —$SO_3M$, —$SO_2NH$—$R_5$, —$SO_2NHCOR_6$, —$CONHSO_2$—$R_7$, and —$SO_2NHSO_2$—$R_8$; M represents a hydrogen atom, or an alkali metal or organic base group for neutralization of charges; and $R_5$, $R_6$, $R_7$, and $R_8$ each independently represents an alkyl group, an alkenyl group, an aryl group, or a heterocyclic ring group.

2. The curable composition according to claim 1, wherein the curable composition comprises at least one selected from a compound represented by the following formula (A) or a compound represented by the following formula (B):

FORMULA (A)

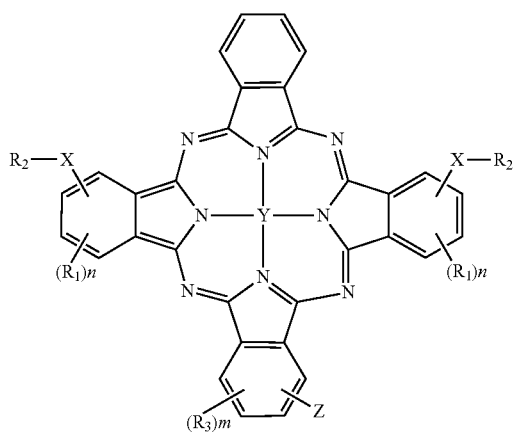

FORMULA (B)

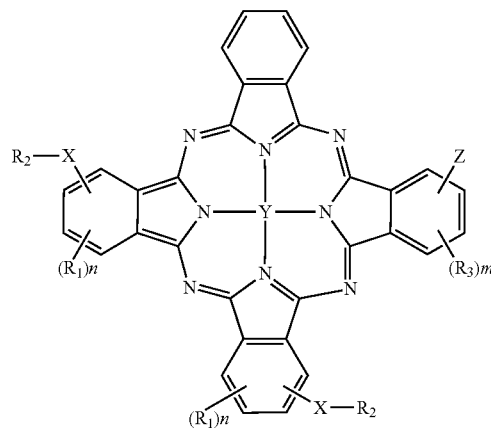

wherein, in formulae (A) and (B), $R_1$, $R_2$, $R_3$, X, Z, n, and m have the same definitions as $R_1$, $R_2$, $R_3$, X, Z, n, and m, respectively, in the formulae (I) and (II); and Y represents a metal atom or a metal compound.

3. The curable composition according to claim 2, wherein Y in the compound represented by the formula (A) or in the compound represented by the formula (B) is Cu.

4. A color filter formed by using the curable composition according to claim 1.

5. A method for preparing a color filter, comprising the steps of applying the curable composition according to claim 1 to a support, and then carrying out exposure and development via a mask to form a pattern.

* * * * *